(12) United States Patent  
Kanaya

(10) Patent No.: US 6,642,563 B2  
(45) Date of Patent: Nov. 4, 2003

(54) SEMICONDUCTOR MEMORY INCLUDING FERROELECTRIC GATE CAPACITOR STRUCTURE, AND METHOD OF FABRICATING THE SAME

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 09/948,574

(22) Filed: Sep. 10, 2001

(65) Prior Publication Data

US 2002/0038402 A1 Mar. 28, 2002

(30) Foreign Application Priority Data

Sep. 28, 2000 (JP) ......................... 2000-296076

(51) Int. Cl.⁷ ............................................. H01L 31/119
(52) U.S. Cl. ................. 257/296; 257/295; 257/302; 257/303; 257/304; 257/305; 257/306; 257/307; 257/308; 257/309; 257/310; 438/253; 438/397; 438/387; 438/638; 438/210
(58) Field of Search .................. 257/295, 296, 257/302, 303, 304, 305, 306, 307, 308, 309, 310; 438/253, 397, 387, 638, 210, 239, 244, 250, 255, 396

(56) References Cited

U.S. PATENT DOCUMENTS

| | | | | |
|---|---|---|---|---|
| 5,384,729 A | * | 1/1995 | Sameshima | 365/145 |
| 5,424,238 A | * | 6/1995 | Sameshima | 437/52 |
| 5,932,904 A | * | 8/1999 | Hsu et al. | 257/295 |
| 5,940,705 A | * | 8/1999 | Lee et al. | 438/258 |
| 5,976,928 A | * | 11/1999 | Kirlin et al. | 438/240 |
| 6,011,285 A | * | 1/2000 | Hsu et al. | 257/295 |
| 6,335,241 B1 | * | 1/2002 | Hieda et al. | 438/253 |
| 6,342,711 B1 | * | 1/2002 | Van Buskirk et al. | 257/295 |
| 6,346,741 B1 | * | 2/2002 | Van Buskirk et al. | 257/664 |
| 6,380,574 B1 | * | 4/2002 | Torii et al. | 257/295 |
| 2002/0037624 A1 | * | 3/2002 | Mori et al. | 438/396 |

FOREIGN PATENT DOCUMENTS

JP 11-330275 11/1999

* cited by examiner

Primary Examiner—Nathan J. Flynn  
Assistant Examiner—Fazli Erdem  
(74) Attorney, Agent, or Firm—Oblon, Spivak, McClelland, Maier & Neustadt, P.C.

(57) ABSTRACT

A semiconductor memory including a ferroelectric gate capacitor structure includes an insulating interlayer formed on the surface of a semiconductor substrate. The insulating interlayer includes a hole at a position corresponding to a channel region. In the channel length direction, the hole extends across the channel region. A ferroelectric gate capacitor structure is formed in the hole. The ferroelectric gate capacitor structure includes a dielectric film, ferroelectric film, and upper electrode formed in this order from the substrate side.

34 Claims, 23 Drawing Sheets

US 6,642,563 B2

SEMICONDUCTOR MEMORY INCLUDING FERROELECTRIC GATE CAPACITOR STRUCTURE, AND METHOD OF FABRICATING THE SAME

CROSS-REFERENCE TO RELATED APPLICATIONS

This application is based upon and claims the benefit of priority from the prior Japanese Patent Application No. 2000-296076, filed Sep. 28, 2000, the entire contents of which are incorporated herein by reference.

BACKGROUND OF THE INVENTION

1. Field of the Invention

The present invention relates to a semiconductor memory including a ferroelectric gate capacitor structure in which a ferroelectric capacitor is incorporated into the gate structure of a transistor, and a method of fabricating the same.

2. Description of the Related Art

In a semiconductor memory including a ferroelectric gate capacitor structure, a ferroelectric capacitor is formed on a transistor. Since a unit cell has only the area of one transistor, therefore, the structure effectively increases the degree of integration. However, the techniques of fabricating semiconductor memories including a ferroelectric gate capacitor structure still have many problems, so such memories have not been fabricated into products yet.

In the formation of this ferroelectric gate capacitor structure, methods using etching techniques are often used. One example of processes of fabricating semiconductor memories including a conventional ferroelectric gate capacitor structure will be described below with reference to sectional views in FIGS. 40A and 40B.

As shown in FIG. 40A, on the entire surface of a silicon substrate 301 in which a source layer 301a and a drain layer 301b are formed, a 5-nm thick dielectric film 302 made of $Bi_2SiO_5$ is formed by CVD or the like. A 10-nm thick Pt film (electrode film) 303 is then formed on the entire surface by using CVD or the like. A 30-nm thick ferroelectric film 304 made of $SrBi_2Ta_2O_9$ is formed on the entire surface by using CVD or the like. A 10-nm thick Pt film (electrode film) 305 is formed on the entire surface by using CVD or the like.

Subsequently, these dielectric film 302, Pt film 303, ferroelectric film 304, and Pt film 305 are selectively removed by dry etching such as RIE (Reactive Ion Etching) by using an oxide film or a resist 306 as a mask. Consequently, the source layer 301a and the drain layer 301b are partially exposed.

As shown in FIG. 40B, an insulating interlayer 307 is deposited on the entire surface of the device. This insulating interlayer 307 is selectively removed to form trenches 308d to 308f having a predetermined depth. The insulating interlayer 307 is again selectively removed to form a contact hole 308a reaching the source layer 301a, a contact hole 308b reaching the drain layer 301b, and a contact hole 308c reaching the Pt film 305. A metal is deposited in a range including the interiors of the contact holes 308a to 308c and the trenches 308d to 308f. After that, the surface of the device is planarized to expose the insulating interlayer 307. Consequently, contact plugs 311a to 311c and lines 311d to 311f are formed.

If, however, RIE is used as dry etching in the step shown in FIG. 40A, plasma damage or chemical damage happens to the dielectric film 302, the Pt film 303, the ferroelectric film 304, and the Pt film 305. If this dry etching is excessively done, damage also happens to the source layer 301a and the drain layer 301b.

As described above, the conventional ferroelectric gate capacitor structure formation process readily causes damage. This damage becomes conspicuous as microfabrication advances, leading to a lowering of the reliability.

A ferroelectric capacitor is representatively formed using platinum (Pt) as upper and lower electrodes and a PZT ($PbZr_{1-x}TiO_x$) film as a ferroelectric film. To form an FeRAM by an LSI process using a silicon substrate, the surface of the silicon substrate is covered with an insulating film such as an oxide film. On this insulating film, a lower Pt electrode, PZT film, and upper Pt electrode are formed by patterning, thereby fabricating a ferroelectric capacitor. Usually, a Ti or $TiO_x$ film is formed below the lower Pt electrode to improve the adhesion.

In this conventional ferroelectric capacitor, a reducing gas such as hydrogen contained in the Si-LSI process deteriorates the ferroelectric characteristic. More specifically, the spontaneous polarization amount reduces. To prevent this deterioration of the characteristic of a ferroelectric capacitor caused by hydrogen reduction, several countermeasures which prevent invasion of hydrogen and the like into the capacitor have been conventionally proposed. However, none of them is simple and reliable.

In addition to this characteristic deterioration by hydrogen reduction, the characteristics of a ferroelectric capacitor deteriorate by process damage as described earlier. For example, Jpn. Pat. Appln. KOKAI Publication No. 8-335673 discloses a method which, in order to prevent interdiffusion between a ferro-electric capacitor such as PZT and an $SiO_2$ insulating film, covers the ferroelectric capacitor with a diffusion preventing film so that the capacitor and the insulating film do not directly contact each other. This reference describes that $TiO_2$, $ZrO_2$, $Al_2O_3$, and the like are effective as the diffusion preventing film. However, the problem in this reference is peeling of the capacitor ferroelectric film by interdiffusion; the reference does not regard deterioration of the ferroelectric capacitor characteristic by hydrogen reduction occurring in the fabrication process as a problem.

Recent research by the present inventors has revealed that using $TiO_x$ as an adhesive layer between a ferroelectric capacitor and an $SiO_2$ insulating film brings about several inconveniences. For example, the ferroelectric characteristic deteriorates when Ti diffuses into a PZT film.

BRIEF SUMMARY OF THE INVENTION

According to the first aspect of the present invention, there is provided a semiconductor memory including a ferroelectric gate capacitor structure, comprising a semiconductor substrate, a source layer and a drain layer formed in a surface of the substrate, the source layer and the drain layer opposing each other in a channel length direction with a channel region in the surface of the substrate interposed therebetween, an insulating interlayer formed on the surface of the substrate to extend from the source layer to the drain layer, the insulating interlayer including a hole at a position corresponding to the channel region, and the hole extending across the channel region in the channel length direction, a capacitor insulating film comprising a ferroelectric film and formed to cover bottom and side surfaces of the hole, the capacitor insulating film including a first recess at a position corresponding to the channel region, an upper electrode formed to cover bottom and side surfaces of the first recess, and a dielectric film formed between the substrate and the capacitor insulating film to cover the bottom surface of the hole.

According to the second aspect of the present invention, there is provided a semiconductor memory including a ferroelectric gate capacitor structure, comprising a semiconductor substrate, a source layer and a drain layer formed in a surface of the substrate, the source layer and the drain layer opposing each other in a channel length direction with a channel region in the surface of the substrate interposed therebetween, an insulating interlayer formed on the surface of the substrate to extend from the source layer to the drain layer, the insulating interlayer including a hole at a position corresponding to the channel region, and the hole extending across the channel region in the channel length direction, a capacitor insulating film comprising a ferroelectric film formed to cover a bottom surface of the hole and contact side surfaces of the hole, and an upper electrode formed to cover the capacitor insulating film in the hole and contact the side surfaces of the hole, wherein the capacitor insulating film and the upper electrode have different lengths in the channel length direction, and first and second portions of the hole on the same level as the capacitor insulating film and the upper electrode have different lengths in the channel length direction.

According to the third aspect of the present invention, there is provided a method of fabricating a semiconductor memory including a ferroelectric gate capacitor structure, comprising forming a source layer and a drain layer in a surface of a semiconductor substrate, the source layer and the drain layer opposing each other in a channel length direction with a channel region in the surface of the substrate interposed therebetween, forming, on the surface of the substrate, an insulating interlayer extending from the source layer to the drain layer and including a hole at a position corresponding to the channel region, the hole extending across the channel region in the channel length direction, sequentially stacking a dielectric film, a capacitor insulating film comprising a ferroelectric film, and an upper electrode film on the insulating interlayer to cover bottom and side surfaces of the hole, and removing portions of the dielectric film, the capacitor insulating film, and the upper electrode film on the insulating interlayer by planarization.

According to the fourth aspect of the present invention, there is provided a method of fabricating a semiconductor memory including a ferroelectric gate capacitor structure, comprising forming a source layer and a drain layer in a surface of a semiconductor substrate, the source layer and the drain layer opposing each other in a channel length direction with a channel region in the surface of the substrate interposed therebetween, forming, on or above the surface of the substrate, a first insulating interlayer extending from the source layer to the drain layer and including a first recess at a position corresponding to the channel region, stacking a capacitor insulating film comprising a ferroelectric film on the first insulating interlayer to cover bottom and side surfaces of the first recess, removing a portion of the capacitor insulating film on the first insulating interlayer by planarization, thereby leaving the capacitor insulating film in the first recess, forming, on the first insulating interlayer and the capacitor insulating film, a second insulating interlayer including a second recess at a position corresponding to the channel region and exposing the capacitor insulating film, the first and second recesses having different lengths in the channel length direction, depositing an upper electrode film on the second insulating interlayer to cover bottom and side surfaces of the second recess, and removing a portion of the upper electrode film on the second insulating interlayer by planarization.

DETAILED DESCRIPTION OF THE INVENTION

Figure 1:
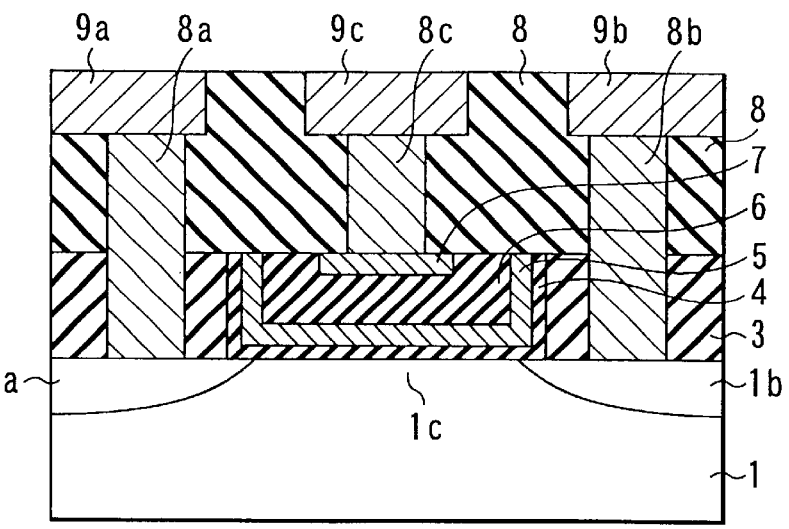
FIG. 1 is a longitudinal sectional view showing the whole construction of a semiconductor device according to the first embodiment of the present invention.

Embodiments of the present invention will be described below with reference to the accompanying drawings. In the following description, the same reference numerals denote parts having substantially the same functions and arrangements, and a duplicate explanation will be made only where necessary. Also, a detailed description of common fabrication steps will be omitted.

First Embodiment

FIG. 1 is a longitudinal sectional view showing the whole construction of a semiconductor device according to the first embodiment of the present invention. In this embodiment, the present invention is applied to an MFMIS (electrode/ferroelectric film/electrode/dielectric film/semiconductor) structure.

As shown in FIG. 1, a source layer 1a and a drain layer 1b are formed in the surface of an Si substrate 1. These source layer 1a and drain layer 1b oppose each other in the channel length direction on the two sides of a channel region 1c in the surface of the substrate 1. An insulating interlayer 3 is formed on the Si substrate 1. A trench (hole) is formed in this insulating interlayer 3. On the Si substrate 1, this trench is formed from a portion above the channel region 1c so as to overlap portions of the source layer 1a and the drain layer 1b. In this trench, a 5-nm thick dielectric film 4 made of, e.g., $Bi_2SiO_5$ is formed to cover the bottom and side surfaces of the trench. In addition, a 10-nm thick Pt film (lower electrode film) 5 is formed to cover the bottom and side surfaces of a recess in this dielectric film 4. Also, a 30-nm thick SBT ferroelectric film 6 is formed to cover the bottom and side surfaces of a recess in this Pt film 5. Furthermore, a 10-nm thick Pt film (upper electrode film) 7 is formed to cover the bottom and side surfaces of this ferroelectric film 6. The trench is filled with these dielectric film 4, Pt film 5, ferroelectric film 6, and Pt film 7. Each of the dielectric film 4, the Pt film 5, and the dielectric film 6 has a U sectional shape. Note that in the following description, a component simply called a dielectric film indicates a dielectric film having no ferroelectricity, e.g., a high-dielectric film.

An insulating interlayer 8 is formed on the insulating interlayer 3. Contact plugs 8a to 8c are formed in these insulating interlayers 3 and 8. That is, the contact plug 8a is formed by burying a metal in a contact hole reaching the source layer 1a through the insulating interlayers 3 and 8. The contact plug 8b is formed by burying a metal in a contact hole reaching the drain 1b through the insulating interlayers 3 and 8. The contact plug 8c is formed by burying a metal in a contact hole reaching the Pt film 7 through the insulating interlayer 8. Also, trenches are formed in this insulating interlayer 8 so as to overlap these contact plugs 8a to 8c. In these trenches, lines 9a to 9c electrically connected to the contact plugs 8a to 8c are formed.

A method of fabricating the semiconductor device according to this embodiment will be described below with reference to sectional views shown in FIGS. 2A to 4B.

Figure 2A:
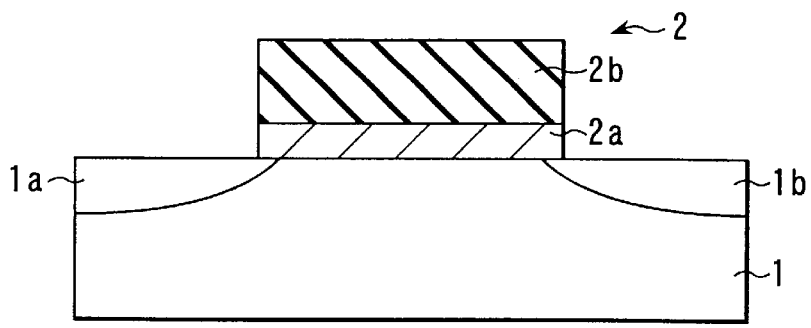
FIGS. 2A, 2B, and 2C are sectional views showing the steps of a method of fabricating the semiconductor device according to the present invention.

First, as shown in FIG. 2A, a poly-Si layer 2a and an SiN layer 2b are sequentially stacked on the entire surface of an Si substrate 1. These poly-Si layer 2a and SiN layer 2b are selectively left on the Si substrate 1 by patterning. A stacked structure of the selectively left SiN layer 2b and poly-Si layer 2a functions as a dummy gate (sacrificial structure) 2. This stacked structure of the layers 2a and 2b will be called a dummy gate 2 hereinafter. Note that, although not shown, a gate oxide film 2 is formed on the surface of the Si substrate 1 throughout the following embodiments.

Figure 2B:
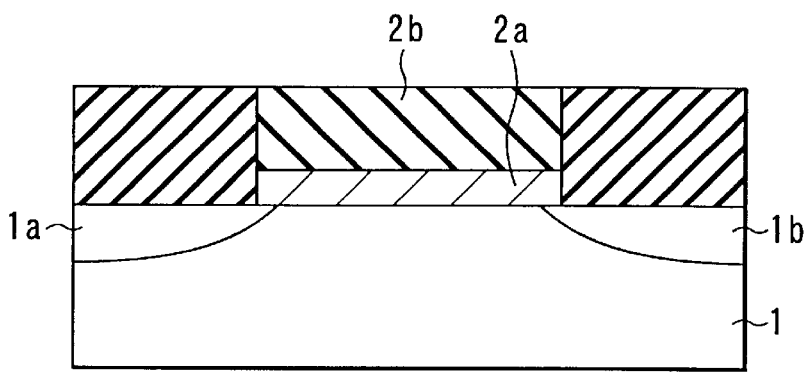

As shown in FIG. 2B, this dummy gate 2 is used as a mask to form a source layer 1a and a drain layer 1b in the surface of the Si substrate 1, by doping an impurity into the surface of the substrate 1 by ion implantation or the like. An insulating interlayer 3 is deposited on the Si substrate 1 in which the source layer 1a and the drain layer 1b are formed. The surface of this insulating interlayer 3 is planarized to expose the dummy gate 2. In this planarization step, the SiN layer 2b functions as a stopper.

Figure 2C:
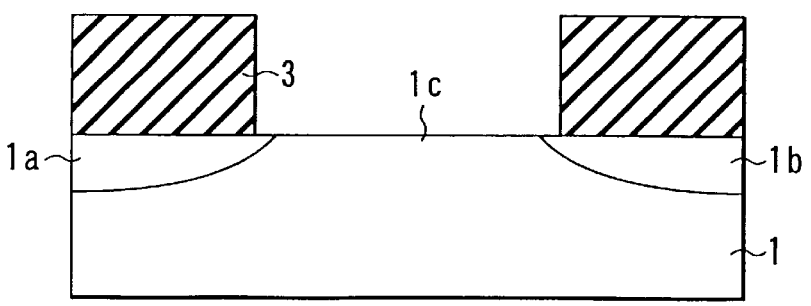

As shown in FIG. 2C, the dummy gate 2 is selectively removed while the insulating interlayer 3 is left behind. This step of removing the dummy gate 2 is done by using wet etching and CDE (Chemical Dry Etching). Since the removal is thus performed without using RIE, damage to the source layer 1a and the drain layer 1b is reduced. A ferroelectric capacitor is formed by removing the dummy gate 2, but a portion from which this dummy gate 2 is not removed also exists. This portion from which the dummy gate 2 is not removed effectively functions as a switching transistor.

Figure 3A:
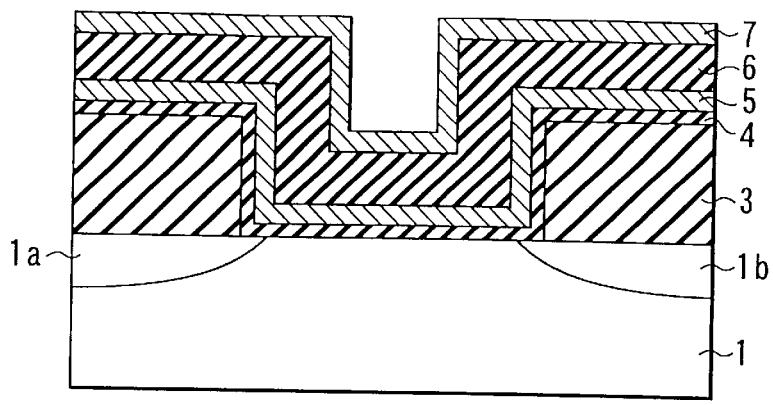
FIGS. 3A and 3B are sectional views showing the steps following FIG. 2C of the method of fabricating the semiconductor device according to the first embodiment.

As a result of this removal of the dummy gate 2, a trench is formed in the insulating interlayer 3 on a channel region 1c sandwiched between the source layer 1a and the drain layer 1b. As shown in FIG. 3A, a dielectric film 4, a Pt film (lower electrode film) 5, a ferroelectric film 6, and a Pt film (upper electrode film) 7 are sequentially stacked on the entire surface of the device. These dielectric film 4, Pt film 5, ferroelectric film 6, and Pt film 7 are successively formed by CVD. Also, these dielectric film 4, Pt film 5, ferroelectric film 6, and Pt film 7 are formed to be thin along the surface of the insulating interlayer 3, and along the shape of the bottom and side surfaces of the trench so as to cover this trench with a substantially uniform film thickness. Accordingly, the dielectric film 4, the Pt film 5, the ferroelectric film 6, and the Pt film 7 assume a sectional shape recessed at the depth of the trench. Furthermore, the trench has in the channel length direction (source/drain direction) a width larger than twice the sum of the film thicknesses of the dielectric film 4, the Pt film 5, the ferroelectric film 6, and the Pt film 7. That is, in this trench the upper surface of the Pt film 7 is lower than that of the insulating interlayer 3.

Figure 3B:
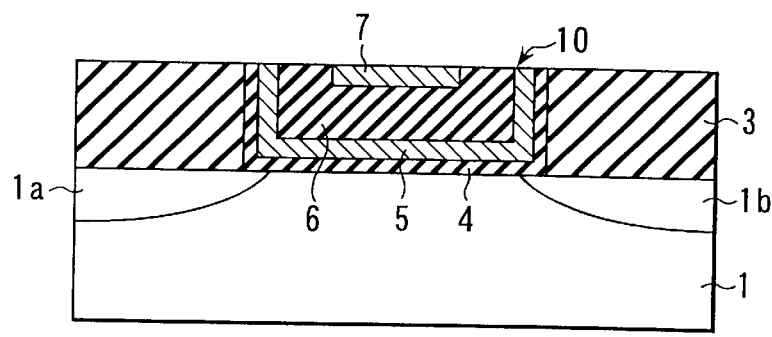

Next, as shown in FIG. 3B, the upper surface of the device is planarized by using CMP. By this planarization, the Pt film 7, the ferroelectric film 6, the Pt film 5, and the dielectric film 4 on the insulating interlayer 3 are removed in this order to expose the surface of the insulating interlayer 3. CMP is continued even after the surface of the insulating interlayer 3 is thus exposed. CMP is terminated when the upper surface of the Pt film 7 formed at the lowest position in the trench is planarized and leveled with the surrounding insulating interlayer 3. The result is a structure in which the bottom and side surfaces of the trench inside the insulating interlayer 3 are covered with the dielectric film 4, the Pt film 5, and the ferroelectric film 6, and the Pt film 7 is buried in the recess of the ferroelectric film 6 (the bottom and side surfaces of the recess are covered with the Pt film 7). These dielectric film 4, Pt film 5, ferroelectric film 6, and Pt film 7 implement a gate capacitor structure 10. The characteristics of the capacitor are further improved if oxygen recovery annealing (600° C.) is performed after that.

Figure 4A:
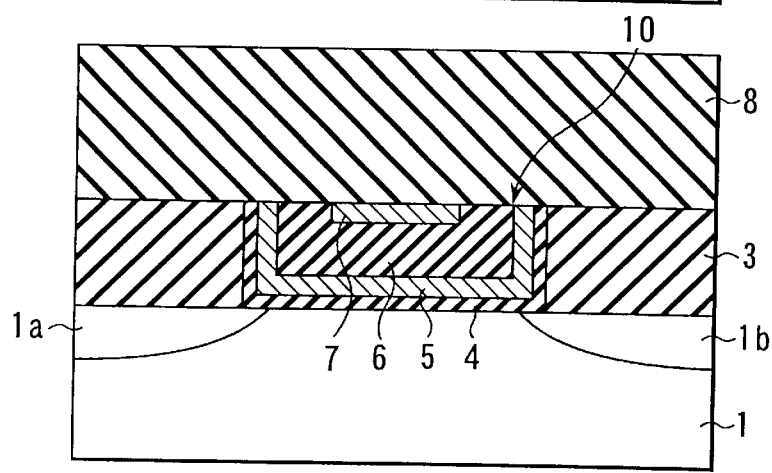
FIGS. 4A and 4B are sectional views showing the steps following FIG. 3B of the method of fabricating the semiconductor device according to the first embodiment.
Figure 4B:
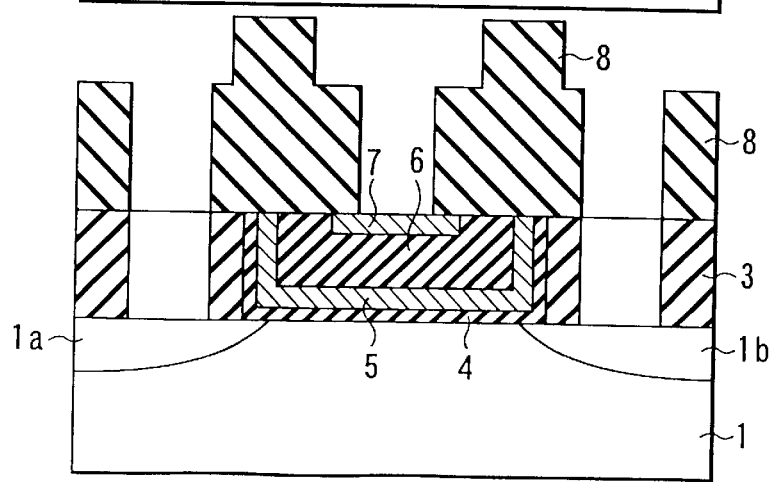

As shown in FIG. 4A, an insulating interlayer 8 is deposited on the insulating interlayer 3 and the gate capacitor structure 10. Next, as shown in FIG. 4B, trenches having the surface of this insulating interlayer 8 as their bottom surfaces are formed. Contact holes reaching the source layer 1a and the drain layer 1b through the insulating interlayers 3 and 8 are formed. Similarly, a contact hole reaching the gate capacitor structure 10 through the insulating interlayer 8 is formed. A metal is buried in these contact holes and trenches to form contact plugs 8a to 8c and lines 9a to 9c. In this manner, the semiconductor device shown in FIG. 1 is implemented.

Figure 5:
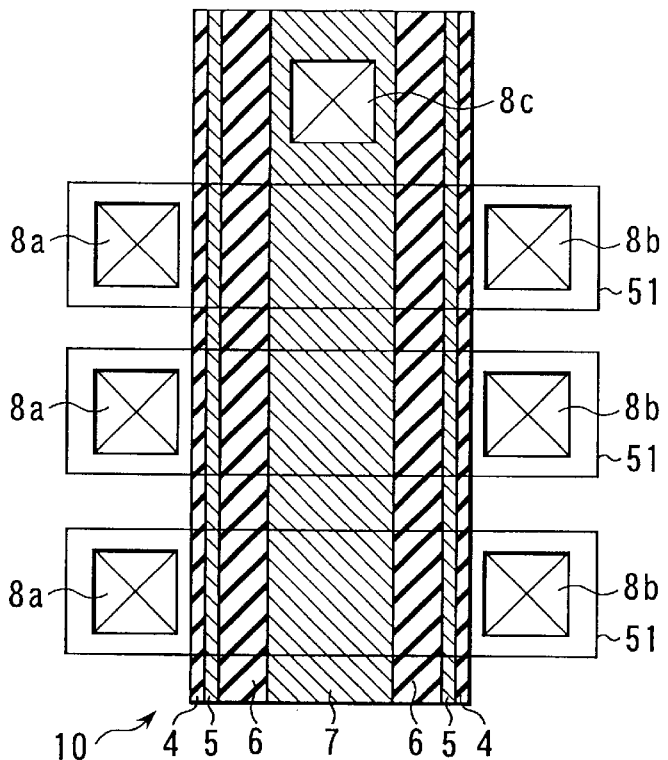
FIG. 5 is a top view of the semiconductor device according to the first embodiment.

FIG. 5 shows the top view of the semiconductor device thus implemented. FIG. 5 is obtained by cutting the device between the insulating interlayers 3 and 8 except for the contact plug 8c formed on the insulating interlayer 3 and electrically connected to the gate capacitor structure 10. This contact plug 8c is shown in FIG. 5 in order to clarify the positional relationship to other components. As shown in FIG. 5, in an active region 51, the gate capacitor structure 10 is formed between the contact plugs 8a and 8b. Also, in this gate capacitor structure 10, the Pt film 7 is formed inside the ferroelectric film 6, the ferroelectric film 6 is formed inside the Pt film 5, and the Pt film 5 is formed inside the dielectric film 4. However, this embodiment is of course not restricted to the arrangement shown in FIG. 5.

Figure 6:
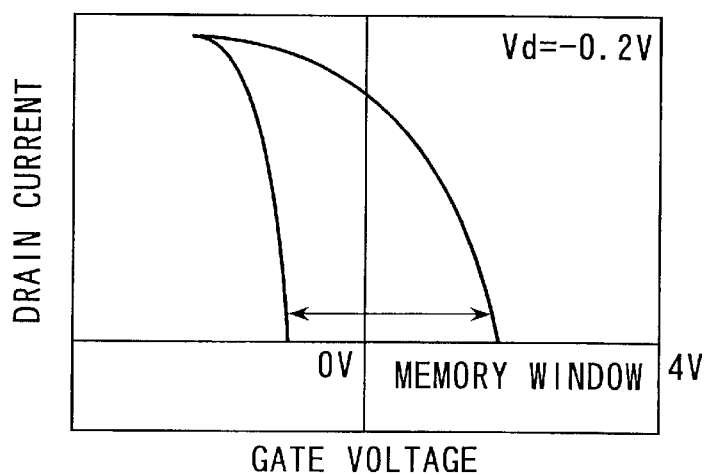
FIG. 6 is a graph showing the relationship between the gate voltage and drain current of a gate capacitor structure according to the first embodiment.

FIG. 6 shows the characteristic of the semiconductor device including the ferroelectric gate capacitor structure fabricated through the above steps. FIG. 6 is a graph showing the memory window of this gate structure, in which the gate voltage is plotted on the abscissa and the drain current on the ordinate. As shown in FIG. 6, the memory window of the gate structure of this embodiment is 4 V, indicating an excellent characteristic.

Figure 7:
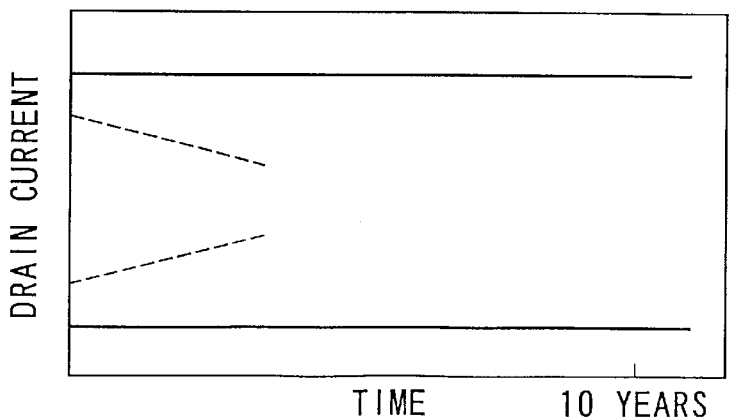
FIG. 7 is a graph showing the holding characteristic of the gate capacitor structure according to the first embodiment.

FIG. 7 shows the holding characteristic of the gate structure of this embodiment. The abscissa indicates time, and the ordinate indicates the drain current. The broken lines show the characteristic of a conventional structure, and the solid lines show the characteristic of the gate structure according to this embodiment. As shown in FIG. 7, in the conventional structure no drain current sufficient for data read can be obtained when the semiconductor device is left to stand for only a few years, much shorter than 10 years. In contrast, the structure of this embodiment has a holding characteristic of 10 years or more. That is, the structure of this embodiment has a holding characteristic far better than that of the conventional structure.

In this embodiment as described above, the insulating interlayer 3 is selectively formed using the dummy gate 2, and the gate capacitor structure 10 is formed in a trench from which the dummy gate 2 is removed. This obviates the need for an etching process in the formation of the gate capacitor structure 10, so neither plasma damage nor chemical damage caused by the use of RIE or the like takes place. Also, when this gate capacitor structure 10 is formed, the insulating interlayer 3 covers most of the source layer 1a and the drain layer 1b. Accordingly, damage occurring when the gate capacitor structure 10 is formed has almost no influence on the source layer 1a and the drain layer 1b.

Second Embodiment

This embodiment relates to a modification of the first embodiment and is characterized in a gate capacitor structure. The rest of the structure and the fabrication process are the same as the first embodiment. Like the first embodiment, a semiconductor device of this embodiment is an example of an MFMIS structure.

Figure 8:
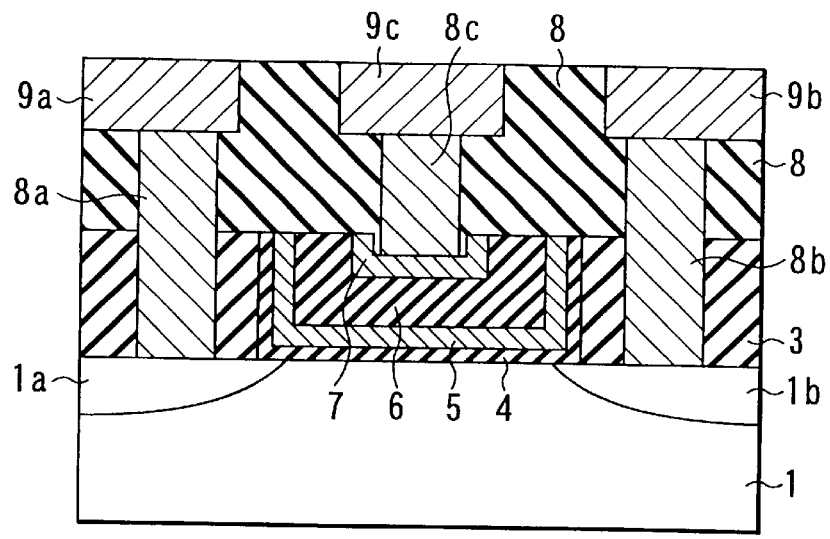
FIG. 8 is a longitudinal sectional view showing the whole construction of a semiconductor device according to the second embodiment of the present invention.

FIG. 8 is a sectional view showing the whole construction of the semiconductor device of this embodiment. As shown in FIG. 8, components forming a gate capacitor structure 81 of this embodiment are a dielectric film 4, a Pt film 5, a ferroelectric film 6, and a Pt film 7. This is the same as the first embodiment. This embodiment differs from the first embodiment in that the surface of the Pt film 7 is not flat, but the section of this Pt film 7 has a recessed shape defined by its bottom and side surfaces. That is, in this embodiment, all of the dielectric film 4, the Pt film 5, the ferroelectric film 6, and the Pt film 7 have a sectional shape recessed near the center of the trench. A contact plug 8c enters the recess of the Pt film 7 and contacts its bottom surface.

Figure 9:
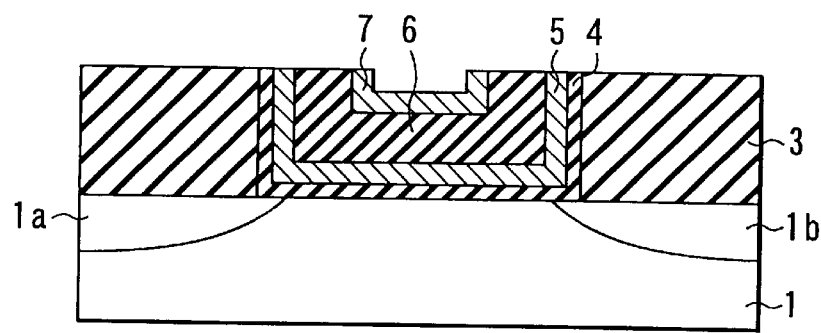
FIG. 9 is a sectional view showing a method of fabricating the semiconductor device according to the second embodiment.

The fabrication steps of the semiconductor device according to this embodiment are the same as the first embodiment from the step shown in FIG. 2A to the step shown in 3A. A difference of this embodiment resides in the step of planarizing the entire surface of the device after the step shown in FIG. 3A. In this embodiment, after the step shown in FIG. 3A the whole device surface is planarized by CMP as shown in FIG. 9. In this planarization, the Pt film 7, the ferroelectric film 6, the Pt film 5, and the dielectric film 4 on an insulating interlayer 3 are sequentially removed until the insulating interlayer 3 is exposed. After the insulating interlayer 3 is exposed, the planarization step is terminated before the plane of planarization reaches the surface of the Pt film 7. In other words, the CMP step is stopped after the surface of the insulating interlayer 3 is exposed and before the surface of the Pt film 7 is removed by CMP. Consequently, as shown in FIG. 9, the Pt film 7 having a U sectional shape formed along the line of the bottom and side surfaces of the ferroelectric film 6 is obtained. Note that the plane of planarization means a plane on which planarization by CMP actually progresses.

After the gate capacitor structure 81 shown in FIG. 9 is obtained, an insulating interlayer 8 is deposited. The steps performed after that are the same as in the first embodiment.

In this embodiment as described above, CMP is terminated before the plane of planarization by CMP reaches the upper surface of the recess in the Pt film 7. This can prevent a decrease of the film thickness of this Pt film 7 (upper electrode) by CMP.

Figure 10:
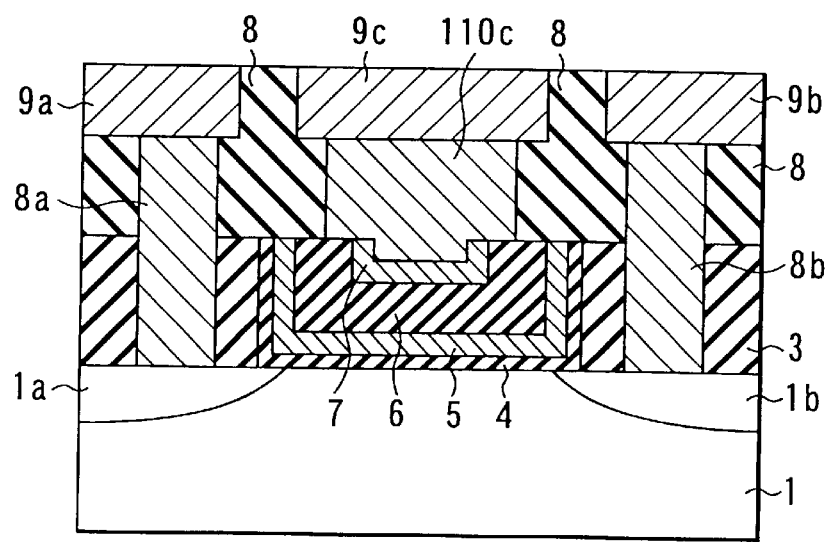
FIG. 10 is a view showing the whole construction of a semiconductor device according to a modification of the second embodiment.

The semiconductor device of this embodiment is not limited to the structure shown in FIG. 8. FIG. 10 is a sectional view showing a modification of this embodiment. A semiconductor device shown in FIG. 10 differs from the semiconductor device shown in FIG. 8 in the structure of a gate contact. As shown in FIG. 10, a contact plug 110c of this modification has a larger contact width in the channel length direction than that of the contact plug 8c shown in FIG. 8. Therefore, the contact plug 110c contacts the bottom and side surfaces of the recess in the Pt film 7 and is also formed on the surface of the ferroelectric film 6. In addition, since the contact width of this contact plug 110c is large, a line 9c electrically connected to this contact plug 110c is formed to have a line width larger than the line width shown in FIG. 8.

As described above, even a contact plug having a large contact width, which reaches not only the Pt film 7 as an upper electrode but also the ferroelectric film 6, can achieve the same effect as in this embodiment.

Third Embodiment

This invention relates to a modification of the first embodiment. This embodiment differs from the first embodiment in that the present invention is applied to an MFIS (electrode/ferroelectric film/dielectric film/semiconductor) structure.

Figure 11:
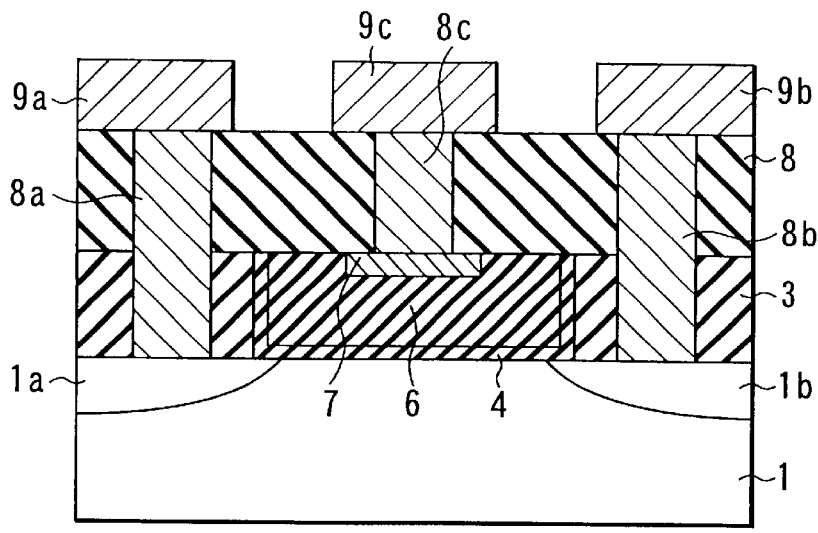
FIG. 11 is a longitudinal sectional view showing the whole construction of a semiconductor device according to the third embodiment of the present invention.

FIG. 11 is a longitudinal sectional view showing the whole construction of a semiconductor device according to this embodiment. A difference of the arrangement of this semiconductor device shown in FIG. 11 from that shown in FIG. 1 resides in a gate capacitor structure. In FIG. 1, a gate capacitor structure is formed by a four-layered structure including the dielectric film 4, the Pt film 5, the ferroelectric film 6, and the Pt film 7. In FIG. 11, a gate capacitor structure is formed by a three-layered structure including a dielectric film 4, a ferroelectric film 6, and a Pt film 7. The rest of the arrangement is the same as in FIG. 1.

A method of fabricating the semiconductor device shown in FIG. 11 will be explained with reference to FIG. 12. In this method of fabricating the semiconductor device of this embodiment, the steps shown in FIGS. 2A to 2C of the first embodiment are similarly performed. A step shown in FIG. 12 follows the step shown in FIG. 2C.

Figure 12:
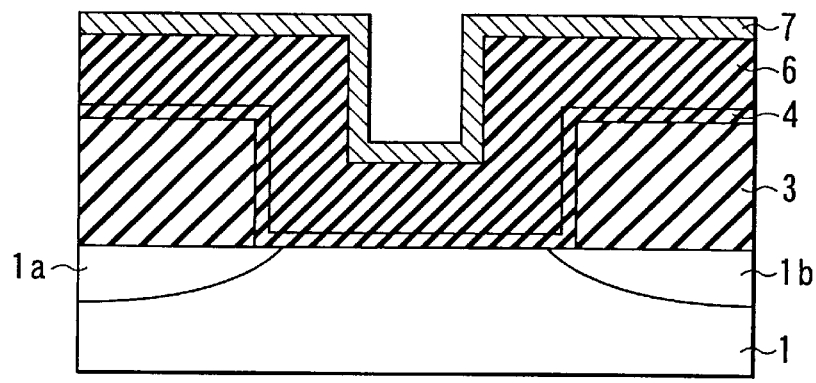
FIG. 12 is a sectional view showing a method of fabricating the semiconductor device according to the third embodiment.

In this step shown in FIG. 12, like the step shown in FIG. 3A, on the entire surface of the device including a trench formed in an insulating interlayer 3, a dielectric film 4, a ferroelectric film 6, and a Pt film 7 are continuously formed to be thin along the surface of the insulating interlayer 3, and along the shape of the bottom and side surfaces of the trench so as to cover this trench with a substantially uniform film thickness. A difference from FIG. 3A resides in that no Pt film 5 is formed between the dielectric film 4 and the ferroelectric film 6. Accordingly, the dielectric film 4, the ferroelectric film 6, and the Pt film 7 have a sectional shape recessed at the depth of the trench.

Subsequently, as in the step shown in FIG. 3B, the upper surface of the device is planarized by using CMP. This planarization is continued until the plane of planarization reaches the surface of the Pt film 7. The result is a structure in which the bottom and side surfaces of the trench are covered with the dielectric film 4 and the ferroelectric film 6, and the Pt film 7 is buried in the recess of the ferroelectric film 6 (the bottom and side surfaces of the recess are covered with the Pt film 7). These dielectric film 4, ferroelectric film 6, and Pt film 7 implement a gate capacitor structure. After that, an insulating interlayer 8 is deposited and contact plugs 8a to 8c and lines 9a to 9c are formed as in the first embodiment.

In this embodiment as described above, even a semiconductor device including a ferroelectric gate capacitor with an MFIS (electrode/ferroelectric film/dielectric film/semiconductor) structure can achieve the same effects as the first embodiment.

This embodiment is not limited to the arrangement shown in FIG. 11.

Figure 13:
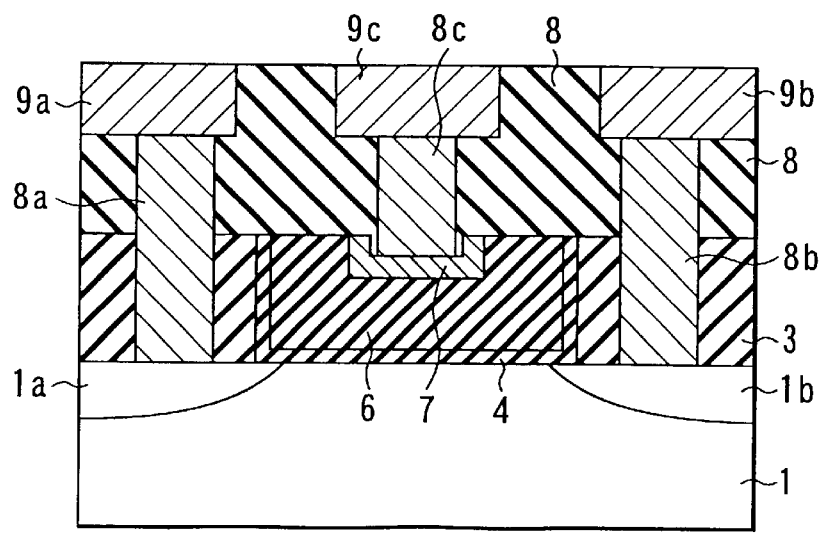
FIG. 13 is a sectional view showing the first modification of the semiconductor device according to the third embodiment.

FIG. 13 shows the first modification of this embodiment. The relationship between FIGS. 13 and 11 is the same as that between FIGS. 8 and 1. That is, the structure shown in FIG. 8 is obtained by putting forward the end point of planarization of the dielectric film 4 and so forth in the CMP process shown in FIG. 1. Likewise, the structure shown in FIG. 13 is obtained by advancing the end point of planarization of the dielectric film 4 and so forth in the CMP process shown in FIG. 11.

Figure 14:
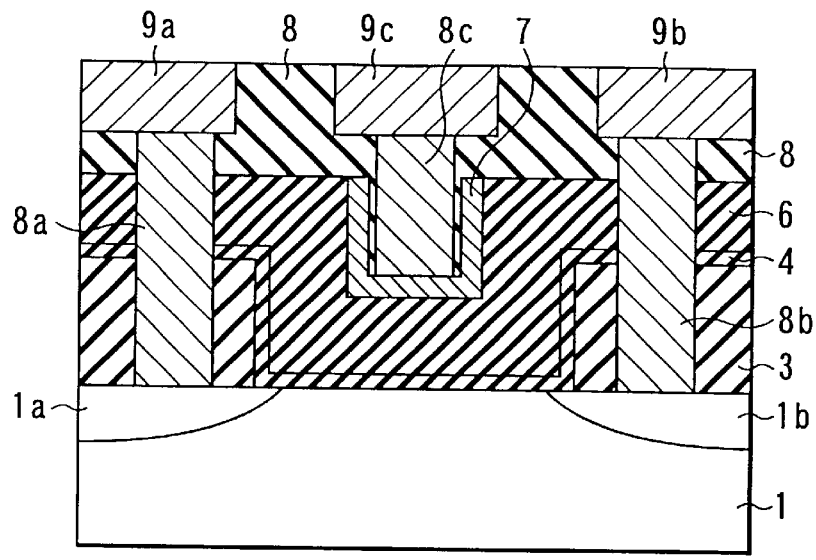
FIG. 14 is a sectional view showing the second modification of the semiconductor device according to the third embodiment.

FIG. 14 shows the second modification of this embodiment. The structure shown in FIG. 14 is obtained by further advancing, more than that in FIG. 13, the end point of planarization of the dielectric film 4 and so forth in the CMP process for obtaining the construction shown in FIG. 13. More specifically, planarization is terminated when the ferroelectric film 6 is exposed. Consequently, the fabrication of the gate capacitor structure is completed when the dielectric film 4 and the ferroelectric film 6 are left behind on the insulating interlayer 3. The result is a gate capacitor structure in which the dielectric film 4 and the ferroelectric film 6 are stacked on the insulating interlayer 3, and the dielectric film 4, the ferroelectric film 6, and the Pt film 7 having a recessed shape are buried in the trench. To obtain this second modification, the CMP removal selectivity of the Pt film 7 to the ferroelectric film 6 is desirably higher than in the first modification or in the construction shown in FIG. 11. The "CMP removal selectivity" is the ratio of rates at which different substances are removed by CMP. In this second modification, the CMP removal selectivity of the Pt film 7 to the ferroelectric film 6 is preferably higher than in the first modification and the like, i.e., a high CMP removal rate is preferred.

Figure 15A:
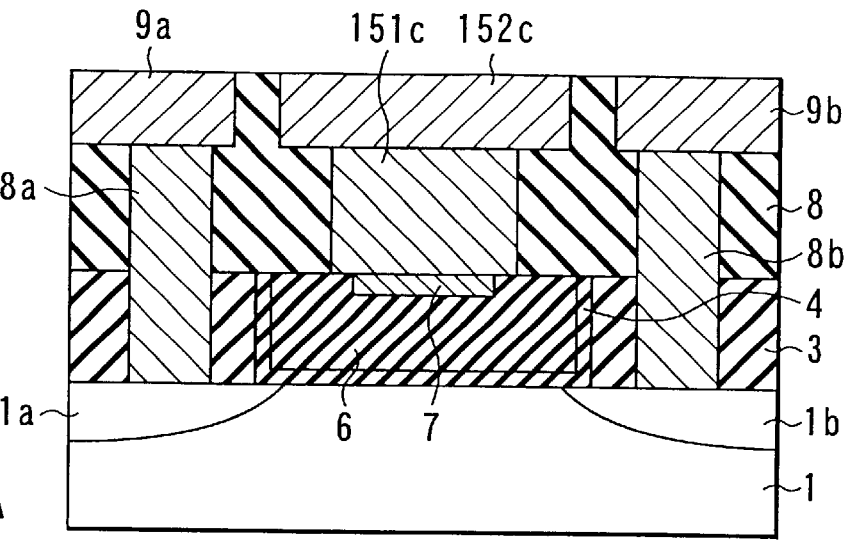
FIGS. 15A, 15B, and 15C are sectional views showing the third modification of the semiconductor device according to the third embodiment.
Figure 15B:
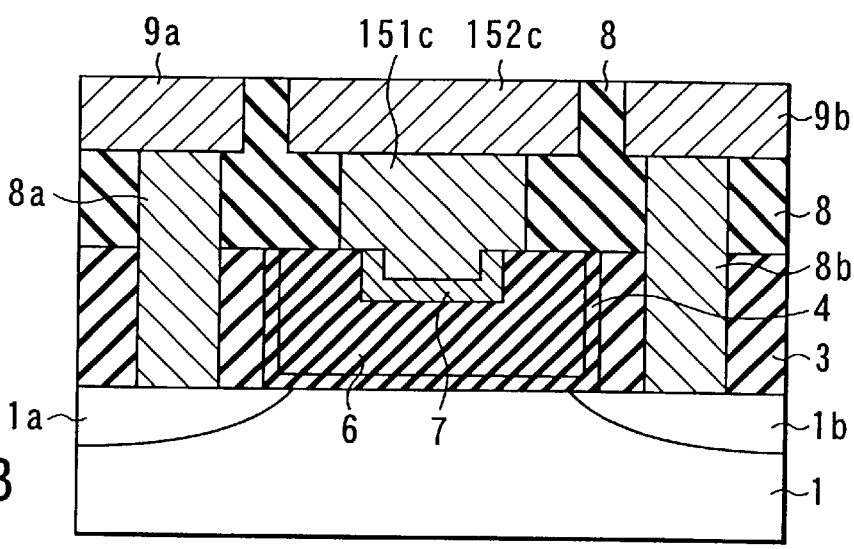
Figure 15C:
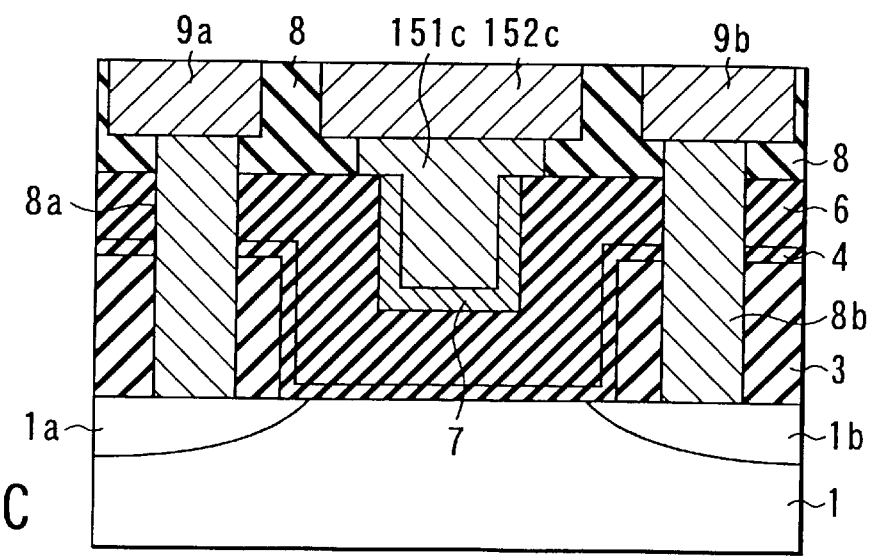

The third modification of this embodiment is a structure having a gate contact with a larger contact width than shown in FIGS. 11, 13, and 14. FIGS. 15A to 15C show the whole construction of the third modification. FIGS. 15A, 15B, and 15C correspond to FIGS. 11, 13, and 14, respectively. Each of FIGS. 15A to 15C has a contact plug 151c with a contact width larger than that of the contact plug 8c shown in FIGS. 11, 13, and 14. Referring to FIGS. 15B and 15C, this contact plug 151c contacts the bottom and side surfaces of the recess in the Pt film 7. Also, to overlap this contact plug 151c having a large contact width, a line 152c has a line width larger than that of the line 9c shown in FIGS. 11, 13, and 14.

Fourth Embodiment

This invention relates to a modification of the first embodiment. This embodiment differs from the first embodiment in that the present invention is applied to an MFS (electrode/ferroelectric film/semiconductor) structure.

Figure 16:
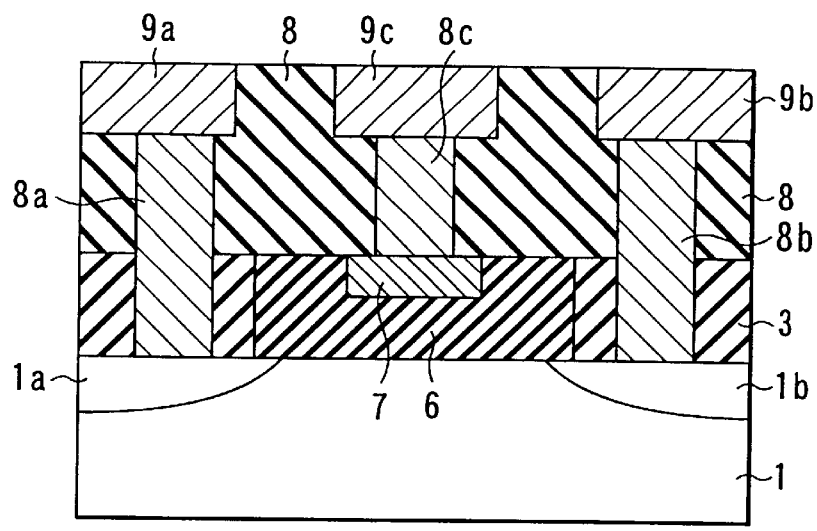
FIG. 16 is a longitudinal sectional view showing the whole construction of a semiconductor device according to the fourth embodiment of the present invention.

FIG. 16 is a longitudinal sectional view showing the whole construction of a semiconductor device according to this embodiment. A difference of the arrangement of this semiconductor device shown in FIG. 16 from that shown in FIG. 1 resides in a gate capacitor structure. In FIG. 1, a gate capacitor structure is formed by a four-layered structure including the dielectric film 4, the Pt film 5, the ferroelectric film 6, and the Pt film 7. In FIG. 16, a gate capacitor structure is formed by a two-layered structure including a ferroelectric film 6 and a Pt film 7. The rest of the arrangement is the same as in FIG. 1.

Figure 17:
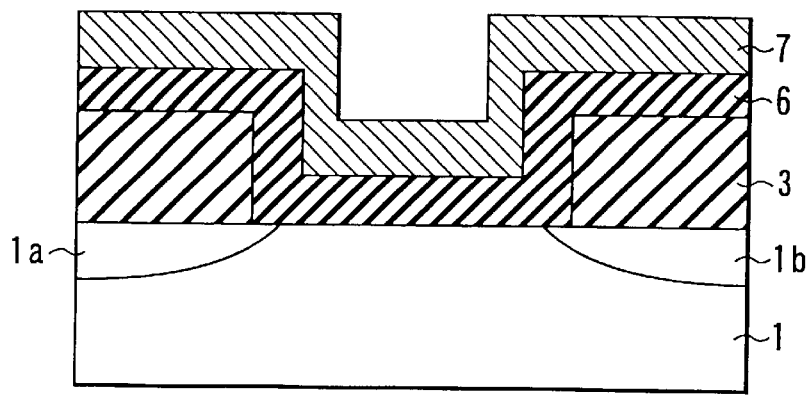
FIG. 17 is a sectional view showing a method of fabricating the semiconductor device according to the fourth embodiment.

A method of fabricating the semiconductor device shown in FIG. 16 will be explained with reference to FIG. 17. In this method of fabricating the semiconductor device of this embodiment shown in FIG. 17, the steps shown in FIGS. 2A to 2C are similarly performed. A step shown in FIG. 17 follows the step shown in FIG. 2C. In this step shown in FIG. 17, like the step shown in FIG. 3A, on the entire surface of the device including a trench formed in an insulating interlayer 3, a ferroelectric film 6 and a Pt film 7 are continuously formed to be thin along the surface of the insulating interlayer 3, and along the shape of the bottom and side surfaces of the trench so as to cover this trench with a substantially uniform film thickness. A difference from FIG. 3A resides in that neither a dielectric film 4 nor a Pt film 5 is formed. Accordingly, the ferroelectric film 6 and the Pt film 7 have a sectional shape recessed at the depth of the trench.

Subsequently, as in the step shown in FIG. 3B, the upper surface of the device is planarized by using CMP. This planarization is continued until the plane of planarization reaches the surface of the Pt film 7. The result is a structure in which the bottom and side surfaces of the trench are covered with the ferroelectric film 6, and the Pt film 7 is buried in the recess of the ferroelectric film 6 (the bottom and side surfaces of the recess are covered with the Pt film 7). After that, an insulating interlayer 8 is deposited and contact plugs 8a to 8c and lines 9a to 9c are formed as in the first embodiment.

In this embodiment as described above, even a semiconductor device including a ferroelectric gate capacitor with an MFS (electrode/ferroelectric film/semiconductor) structure can achieve the same effects as the first embodiment.

This embodiment is not limited to the arrangement shown in FIG. 16.

Figure 18:
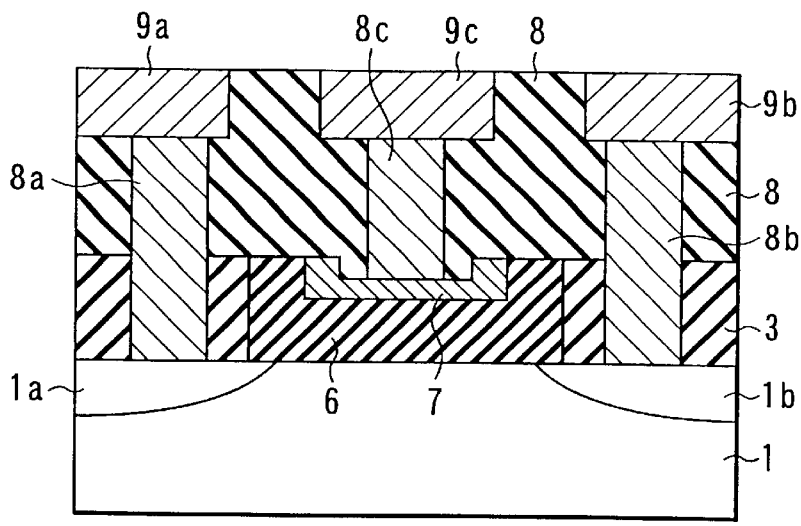
FIG. 18 is a sectional view showing the first modification of the semiconductor device according to the fourth embodiment.

FIG. 18 shows the first modification of this embodiment. The relationship between FIGS. 18 and 11 is the same as that between FIGS. 8 and 1. That is, the structure shown in FIG. 8 is obtained by putting forward the end point of planarization of the dielectric film 4 and so forth in the CMP process shown in FIG. 1. Likewise, the structure shown in FIG. 18 is obtained by advancing the end point of planarization of the dielectric film 4 and so forth in the CMP process shown in FIG. 16.

Figure 19:
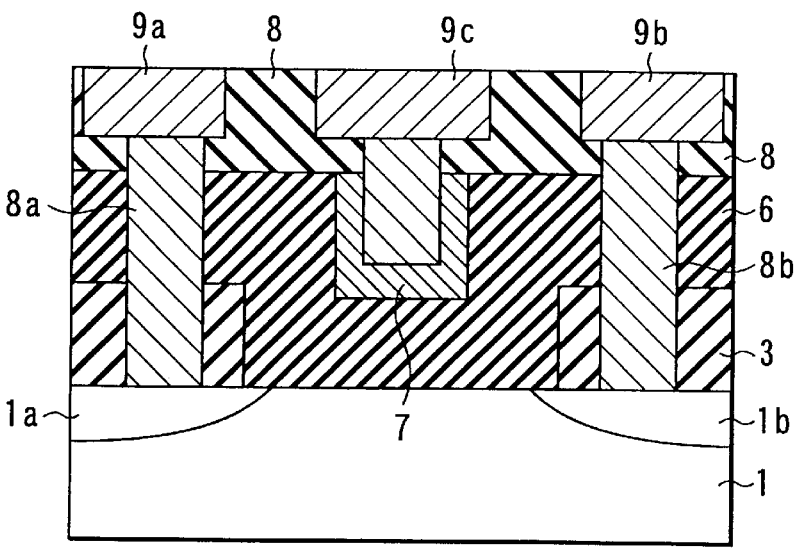
FIG. 19 is a sectional view showing the second modification of the semiconductor device according to the fourth embodiment.

FIG. 19 shows the second modification of this embodiment. The structure shown in FIG. 19 is obtained by further advancing, more than that in FIG. 18, the end point of planarization of the dielectric film 4 and so forth in the CMP process for obtaining the construction shown in FIG. 18. More specifically, planarization is terminated when the ferroelectric film 6 is exposed. Consequently, the fabrication of the gate capacitor structure is completed when the ferroelectric film 6 is left behind on the insulating interlayer 3. The result is a gate capacitor structure in which the ferroelectric film 6 is formed on the insulating interlayer 3, and the ferroelectric film 6 and the Pt film 7 having a recessed shape are buried in the trench. To obtain this second modification, the CMP removal selectivity of the Pt film 7 to the ferroelectric film 6 is desirably higher than in the first modification or in the construction shown in FIG. 16.

The third modification of this embodiment is a structure having a gate contact with a larger contact width than shown in FIGS. 16, 18, and 19. This structure having a wide gate contact is analogous to that shown in FIGS. 15A, 15B, and 15C, explained in the third embodiment, which correspond to FIGS. 11, 13, and 14, respectively.

Figure 20:
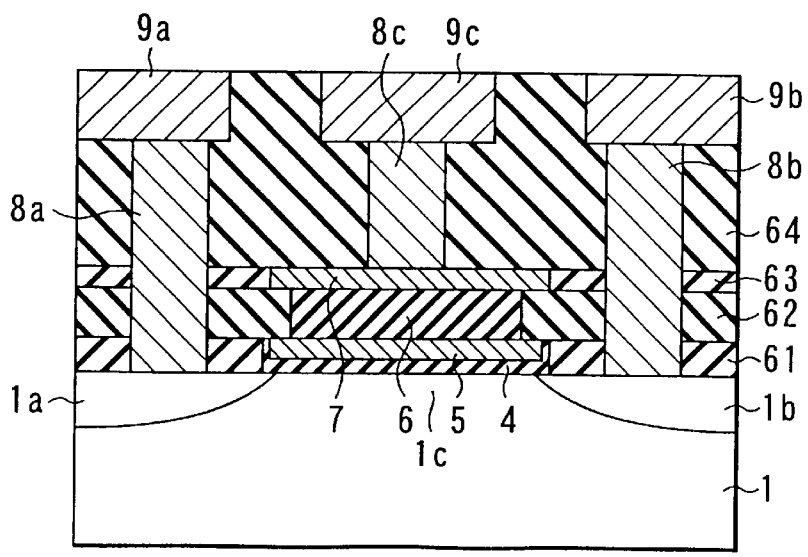
FIG. 20 is a longitudinal sectional view showing the whole construction of a semiconductor device according to the fifth embodiment of the present invention.

Fifth Embodiment FIG. 20 is a longitudinal sectional view showing the whole construction of a semiconductor device according to the fifth embodiment of the present invention. In this embodiment, the present invention is applied to an MFMIS (electrode/ferroelectric film/electrode/dielectric film/semiconductor) structure. This embodiment relates to a modification of the first embodiment. A difference from the first embodiment resides in a gate capacitor structure.

As shown in FIG. 20, a source layer 1a and a drain layer 1b are formed in the surface of an Si substrate 1. These source layer 1a and drain layer 1b oppose each other in the channel length direction on the two sides of a channel region 1c in the surface of the substrate 1. An insulating interlayer 61 is formed on the Si substrate 1. A first trench is formed in this insulating interlayer 61. This first trench is formed on the channel region 1c of the Si substrate 1, where the source layer 1a and the drain layer 1b are not formed. In this first trench, a 5-nm thick dielectric film 4 made of, e.g., $Bi_2SiO_5$ is formed to cover the bottom and side surfaces of the first trench. In addition, a 10-nm thick Pt film 5 is formed to cover the bottom and side surfaces of this dielectric film 4 and fill the first trench.

An insulating interlayer 62 is formed on the insulating interlayer 61 including the first trench. Of this insulating interlayer 62, substantially the same position as the first trench is selectively removed to form a second trench. The width in the channel length direction of this second trench is made smaller than that of the first trench. A 30-nm thick SBT ferroelectric film 6 is formed in the second trench. Accordingly, the ferroelectric film 6 is stacked in contact with the Pt film 5, and the width in the channel length direction of this ferroelectric film 6 is smaller than that of the Pt film 5.

An insulating interlayer 63 is formed on the insulating interlayer 62 including the ferroelectric film 6. Of this insulating interlayer 63, substantially the same position as the second trench is selectively removed to form a third trench. The width F, in the channel length direction of this third trench is made larger than that of the second trench. A 10-nm thick Pt film 7 is formed in the third trench. Accordingly, the Pt film 7 is stacked in contact with the ferroelectric film 6, and the width of this Pt film 7 is larger than that of the ferroelectric film 6.

Furthermore, an insulating interlayer 64 is formed on the insulating interlayer 63 including the Pt film 7. Contact plugs 8a to 8c are formed in these insulating interlayers 61 to 64. That is, the contact plug 8a is formed by burying a metal in a contact hole reaching the source layer 1a through the insulating interlayers 61 to 64. The contact plug 8b is formed by burying a metal in a contact hole reaching the drain layer 1b through the insulating interlayers 61 to 64. The contact plug 8c is formed by burying a metal in a contact hole reaching the Pt film 7 through the insulating interlayer 64. Also, trenches are formed in this insulating interlayer 64 so as to overlap these contact plugs 8a to 8c. In these trenches, lines 9a to 9c electrically connected to the contact plugs 8a to 8c are formed.

A method of fabricating the semiconductor device according to this embodiment will be described below with reference to sectional views shown in FIGS. 21A to 22C.

Figure 21A:
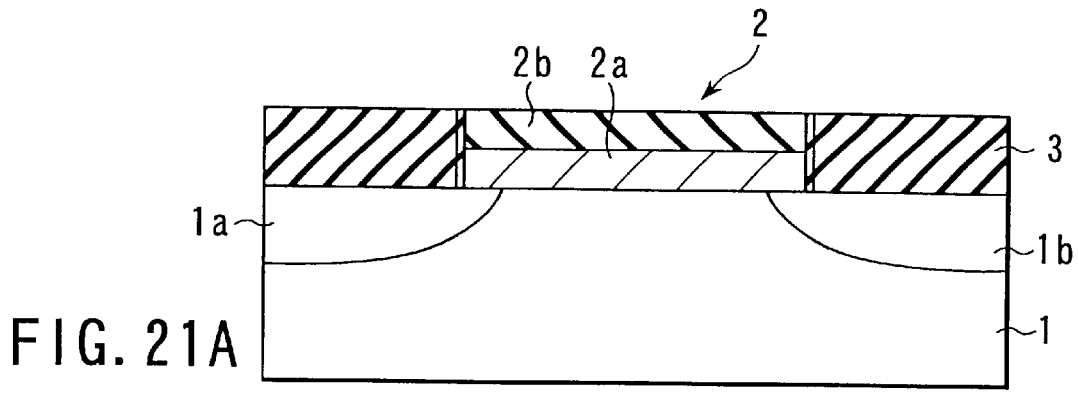
FIGS. 21A, 21B, 21C, and 21D are sectional views showing the steps of a method of fabricating the semiconductor device according to the fifth embodiment.

First, as shown in FIG. 21A, a poly-Si layer 2a and an SiN layer 2b are sequentially stacked on the entire surface of an Si substrate 1. These poly-Si layer 2a and SiN layer 2b are selectively left on the Si substrate 1 by patterning. A stacked structure of the selectively left SiN layer 2b and poly-Si layer 2a functions as a dummy gate (sacrificial structure) 2.

This dummy gate 2 is used as a mask to form a source layer 1a and a drain layer 1b in the surface of the Si substrate 1, by doping an impurity into the surface of the substrate 1 by ion implantation or the like. An insulating interlayer 61 is deposited on the Si substrate 1 in which the source layer 1a and the drain layer 1b are formed. The surface of this insulating interlayer 61 is planarized to expose the dummy gate 2. In this planarization step, the SiN layer 2b functions as a stopper.

Figure 21B:
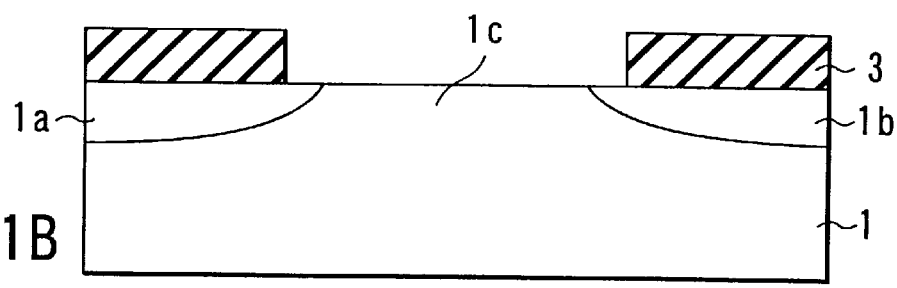

As shown in FIG. 21B, the dummy gate 2 is selectively removed while the insulating interlayer 61 is left behind. This step of removing the dummy gate 2 is done by using wet etching and CDE (Chemical Dry Etching). Since the removal is thus performed without using RIE, damage to the source layer 1a and the drain layer 1b is reduced. As a result of this removal of the dummy gate 2, a first trench is formed inside the insulating interlayer 61 on a channel region 1c sandwiched between the source layer 1a and the drain layer 1b.

Figure 21C:
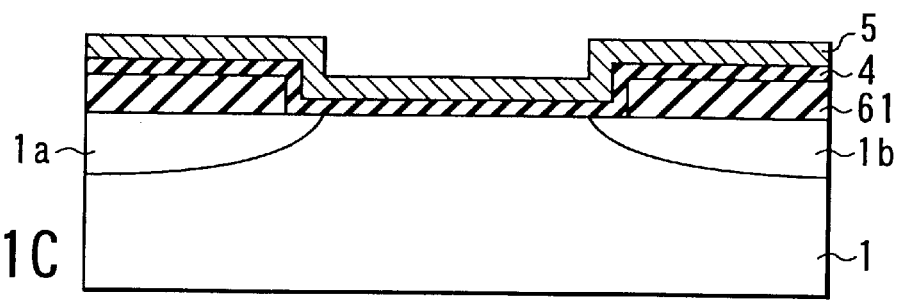

As shown in FIG. 21C, a dielectric film 4 and a Pt film 5 are stacked in this order on the entire surface of the device. The dielectric film 4 and the Pt film 5 are formed by CVD. These dielectric film 4 and Pt film 5 are formed to be thin along the surface of the insulating interlayer 61, and along the shape of the bottom and side surfaces of the first trench so as to cover this first trench with a substantially uniform film thickness. Accordingly, the dielectric film 4 and the Pt film 5 assume a sectional shape recessed at the depth of the trench. Also, the first trench has in the channel length direction a width larger than twice the sum of the film thicknesses of the dielectric film 4 and the Pt film 5. That is, the upper surface of the Pt film 5 is lower than that of the insulating interlayer 61.

Figure 21D:
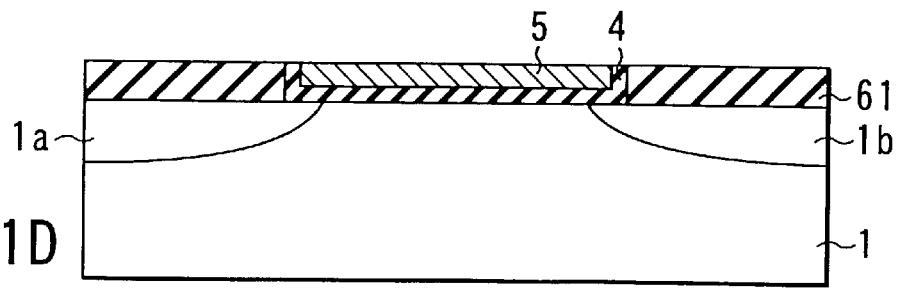

As shown in FIG. 21D, the upper surface of the device is planarized by using CMP. By this planarization, the Pt film 5 and the dielectric film 4 on the insulating interlayer 61 are removed in this order to expose the surface of the insulating interlayer 61. CMP is continued even after the surface of the insulating interlayer 61 is thus exposed. CMP is terminated when the upper surface of the Pt film 5 formed at the lowest position in the trench is planarized and leveled with the surrounding insulating interlayer 61. The result is a structure in which the bottom and side surfaces of the first trench inside the insulating interlayer 61 are covered with the dielectric film 4, and the Pt film 5 is buried in the recess of the dielectric film 4 (the bottom and side surfaces of the recess are covered with the Pt film 5).

Figure 22A:
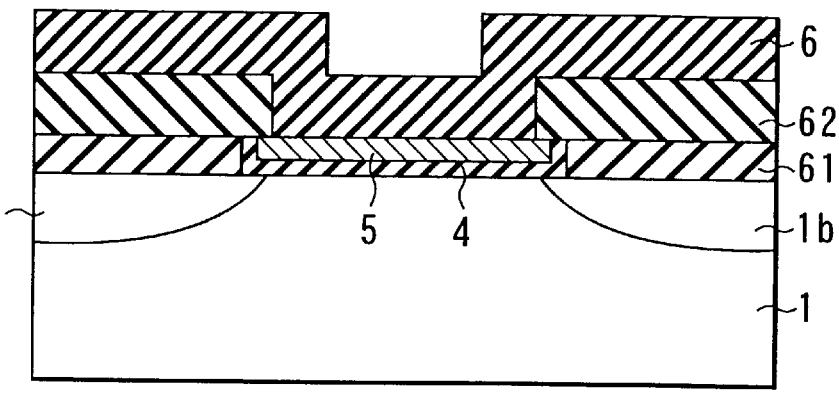
FIGS. 22A, 22B, and 22C are sectional views showing the steps following FIG. 21D of the method of fabricating the semiconductor device according to the fifth embodiment.

As shown in FIG. 22A, an insulating interlayer 62 is deposited on the insulating interlayer 61 and the first trench. This insulating interlayer 62 is selectively removed to form, in substantially the same position as the first trench, a second trench having a width smaller than that of the first trench in the channel length direction. A ferroelectric film 6 is formed on the entire surface of the device including this second trench by CVD or the like. This ferroelectric film 6 is formed to be thin along the surface of the insulating interlayer 62, and along the shape of the bottom and side surfaces of the second trench so as to cover this second trench with a substantially uniform film thickness. Accordingly, the ferroelectric film 6 has a sectional shape recessed at the depth of the second trench.

Next, the upper surface of the device is planarized by using CMP. By this planarization, the ferroelectric film 6 on the insulating interlayer 62 is removed to expose the insulting interlayer 62. CMP is continued even after the surface of the insulating interlayer 62 is thus exposed. Consequently, the surface of this insulating interlayer 62 is removed by a predetermined film thickness and leveled with the surface of the ferroelectric film 6. CMP is terminated in this stage. The result is a structure in which the ferroelectric film 6 is buried in the second trench.

Figure 22B:
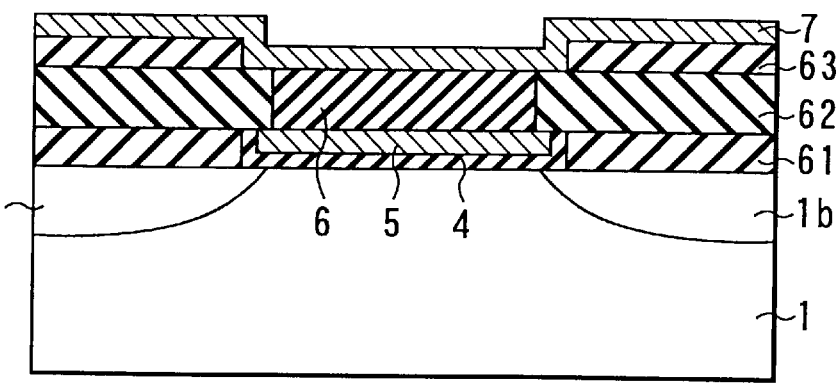

As shown in FIG. 22B, an insulating interlayer 63 is deposited on the insulating interlayer 62 including the ferroelectric film 6. This insulating interlayer 63 is selectively removed to form, in substantially the same position as the second trench, a third trench having a width larger than that of the second trench in the channel length direction. A Pt film 7 is formed on the entire surface of the device including this third trench by CVD or the like. This Pt film 7 is formed to be thin along the surface of the insulating interlayer 63, and along the shape of the bottom and side surfaces of the third trench so as to cover this third trench with a substantially uniform film thickness. Therefore, the Pt film 7 has a sectional shape recessed at the depth of the third trench.

Figure 22C:
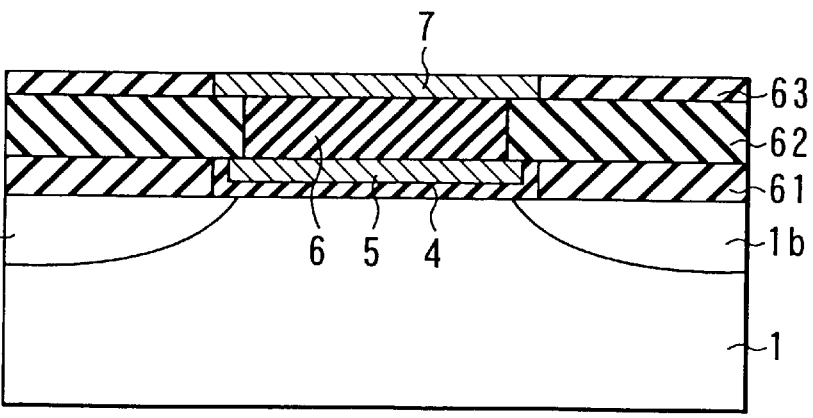

Next, as shown in FIG. 22C, the upper surface of the device is planarized by using CMP. By this planarization, the Pt film 7 on the insulating interlayer 63 is removed to expose the insulting interlayer 63. CMP is continued even after the surface of the insulating interlayer 63 is thus exposed. Consequently, the surface of this insulating interlayer 63 is removed by a predetermined film thickness and leveled with the surface of the Pt film 7. CMP is terminated in this stage. The result is a structure in which the Pt film 7 is buried in the third trench. Note that this third trench is wider than the second trench. Therefore, the Pt film 7 is formed to overlap the ferroelectric film 6.

Furthermore, an insulating interlayer 64 is deposited on the entire device surface, and contact plugs 8a to 8c and lines 9a to 9c are formed. These steps are the same as in the first embodiment.

In this embodiment as described above, the Pt film 5 serving as a lower electrode, the dielectric film 4, the ferroelectric film 6, and the Pt film 7 are selectively formed using CMP. Accordingly, a gate capacitor structure can be formed without any patterning step using dry etching such as RIE. This can realize a gate capacitor structure not suffering plasma or chemical damage occurring when RIE or the like is used. Also, as in the first embodiment, the source layer 1a and the drain layer 1b are formed using the dummy gate 2. This can reduce damage conventionally occurring on the source layer 1a and the drain layer 1b when the gate capacitor structure is patterned after the fabrication of the gate.

Furthermore, the Pt film 5, the dielectric film 4, the ferroelectric film 6, and the Pt film 7 are sequentially formed in separate steps by CMP. Therefore, the areas of these dielectric film 4, Pt film 5, ferroelectric film 6, and Pt film 7 are readily controllable by controlling the widths of trenches formed in insulating interlayers during the formation of these films 4 to 7.

Sixth Embodiment

This embodiment relates to a modification of the fifth embodiment. This embodiment differs from the fifth embodiment in that the present invention is applied to an MFIS (electrode/ferroelectric film/dielectric film/semiconductor) structure.

Figure 23:
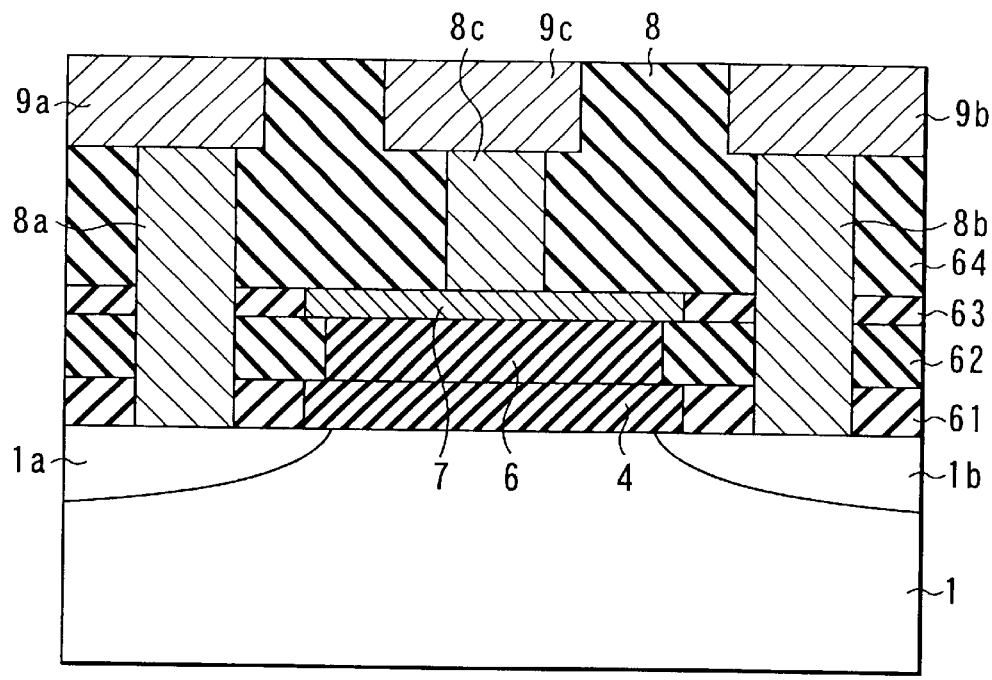
FIG. 23 is a longitudinal sectional view showing the whole construction of a semiconductor device according to the sixth embodiment of the present invention.

FIG. 23 is a longitudinal sectional view showing the whole construction of a semiconductor device according to this embodiment. A difference of the arrangement of this semiconductor device shown in FIG. 23 from that shown in FIG. 20 resides in a gate capacitor structure. In FIG. 20, a gate capacitor structure is formed by a four-layered structure including the dielectric film 4, the Pt film 5, the ferroelectric film 6, and the Pt film 7. In FIG. 23, a gate capacitor structure is formed by a three-layered structure including a dielectric film 4, a ferroelectric film 6, and a Pt film 7. The rest of the arrangement is the same as in FIG. 20.

A method of fabricating the semiconductor device shown in FIG. 23 will be explained with reference to sectional views in FIGS. 24A to 25B. In this method of fabricating the semiconductor device of this embodiment, the steps shown in FIGS. 21A and 21B of the fifth embodiment are similarly performed. A step shown in FIG. 24A follows the step shown in FIG. 21B.

Figure 24A:
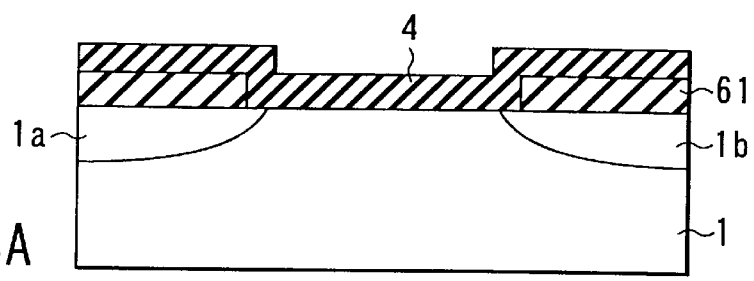
FIGS. 24A, 24B, and 24C are sectional views showing the steps of a method of fabricating the semiconductor device according to the sixth embodiment.

As shown in FIG. 24A, on the entire surface of the device including a first trench formed inside an insulating interlayer 61, a dielectric film 4 is formed to be thin along the surface of the insulating interlayer 61, and along the shape of the bottom and side surfaces of the first trench so as to cover this first trench with a substantially uniform film thickness, by using CVD or the like.

Figure 24B:
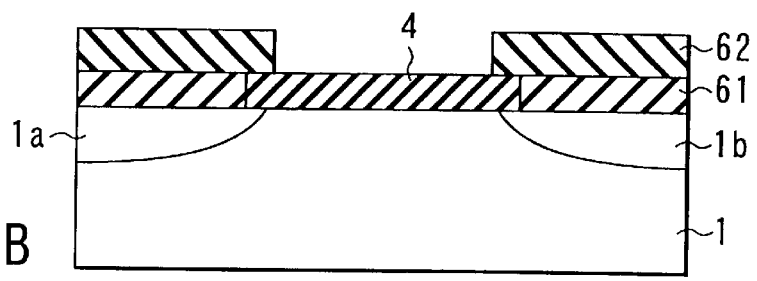

Next, as shown in FIG. 24B, the upper surface of the device is planarized by using CMP. This CMP is continued until the insulting interlayer 61 is exposed and the surface of the insulating interlayer 61 is leveled with the surface of the dielectric film 4 on the first trench. This results in a structure in which the dielectric film 4 is selectively buried in the insulating interlayer 61. An insulating interlayer 62 is deposited on the insulating interlayer 61 including the dielectric film 4. This insulating interlayer 62 is selectively removed to form, in substantially the same position as the first trench, a second trench having a width smaller than that of the first trench in the channel length direction.

Figure 24C:
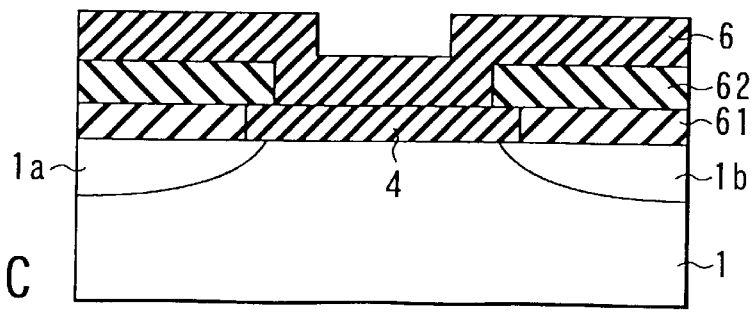

As shown in FIG. 24C, a ferroelectric film 6 is formed on the entire device surface including this second trench by CVD or the like. This ferroelectric film 6 is formed to be thin along the surface of the insulating interlayer 62, and along the shape of the bottom and side surfaces of the second trench so as to cover this second trench with a substantially uniform film thickness. Therefore, the ferroelectric film 6 has a sectional shape recessed at the depth of the second trench.

Figure 25A:
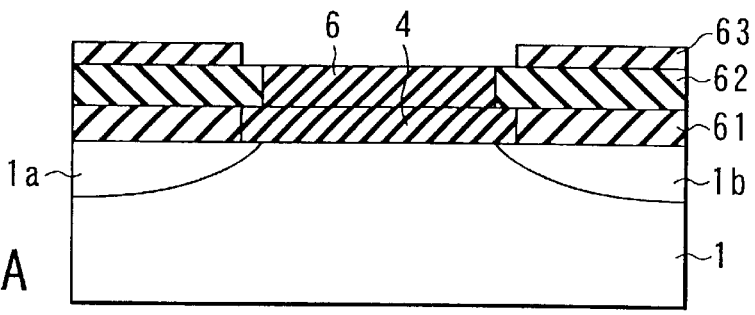
FIGS. 25A and 25B are sectional views showing the steps following FIG. 24C of the method of fabricating the semiconductor device according to the sixth embodiment.
Figure 25B:
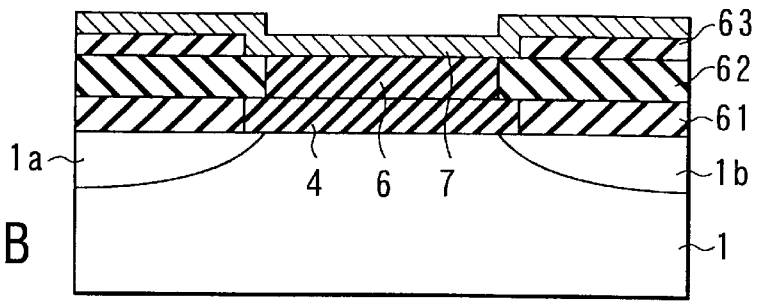

As shown in FIG. 25A, the upper surface of the device is planarized by CMP. As in the formation of the dielectric film 4, the surface of the insulating layer 62 is exposed, and the ferroelectric film 6 having the surface on the same level as the surface of the insulating interlayer 62 is buried in the second trench. An insulating interlayer 63 is then formed on the insulating interlayer 62 including the ferroelectric film 6. This insulating interlayer 63 is selectively removed to form, in substantially the same position as the second trench, a third trench having a width larger than that of the second trench in the channel length direction. As shown in FIG. 25B, a Pt film 7 is formed on the entire device surface including this third trench by CVD or the like. This Pt film 7 is formed to be thin along the surface of the insulating interlayer 63, and along the shape of the bottom and side surfaces of the third trench so as to cover this third trench with a substantially uniform film thickness. Accordingly, the Pt film 7 has a sectional shape recessed at the depth of the third trench. In addition, the surfaces of this Pt film 7 and the insulating interlayer 63 are planarized by using CMP similar to the dielectric film 4 and the ferroelectric film 6. Consequently, as shown in FIG. 23, the Pt film 7 is selectively buried in the third trench in the insulating interlayer 63.

Furthermore, an insulating interlayer 64 is deposited on the entire device surface, and contact plugs 8a to 8c and lines 9a to 9c are formed. These steps are the same as in the fifth embodiment. As a result, the semiconductor device shown in FIG. 23 is obtained.

In this embodiment as described above, even a semiconductor device including a ferroelectric gate capacitor with an MFIS (electrode/ferroelectric film/dielectric film/semiconductor) structure can achieve the same effects as the fifth embodiment.

Seventh Embodiment

This embodiment relates to a modification of the fifth embodiment. This embodiment differs from the fifth embodiment in that the present invention is applied to an MFS (electrode/ferroelectric film/semiconductor) structure.

Figure 26:
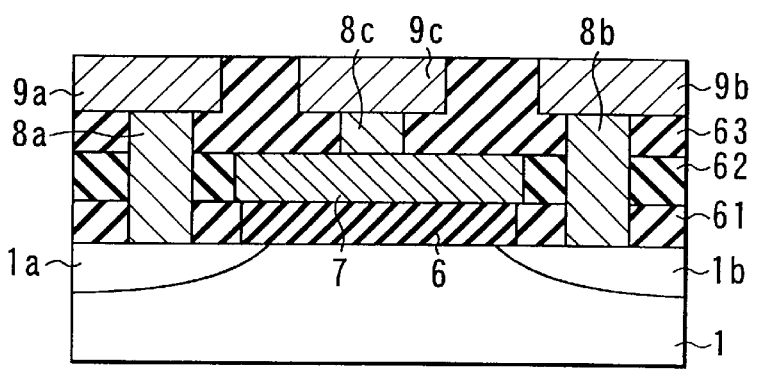
FIG. 26 is a longitudinal sectional view showing the whole construction of a semiconductor device according to the seventh embodiment of the present invention.

FIG. 26 is a longitudinal sectional view showing the whole construction of a semiconductor device according to this embodiment. A difference of the arrangement of this semiconductor device shown in FIG. 26 from that shown in FIG. 20 resides in a gate capacitor structure. In FIG. 20, a gate capacitor structure is formed by a four-layered structure including the dielectric film 4, the Pt film 5, the ferroelectric film 6, and the Pt film 7. In FIG. 26, a gate capacitor structure is formed by a two-layered structure including a ferroelectric film 6 and a Pt film 7. The rest of the arrangement is the same as in FIG. 20.

A method of fabricating the semiconductor device shown in FIG. 26 will be explained with reference to sectional views in FIGS. 27A and 27B. In this method of fabricating the semiconductor device of this embodiment, the steps shown in FIGS. 21A and 21B of the fifth embodiment are similarly performed, and the steps shown in FIGS. 24A and 24B of the sixth embodiment follow except that a ferroelectric film 6 is formed instead of a dielectric film 4. A step shown in FIG. 27A follows the step shown in FIG. 24B.

Figure 27A:
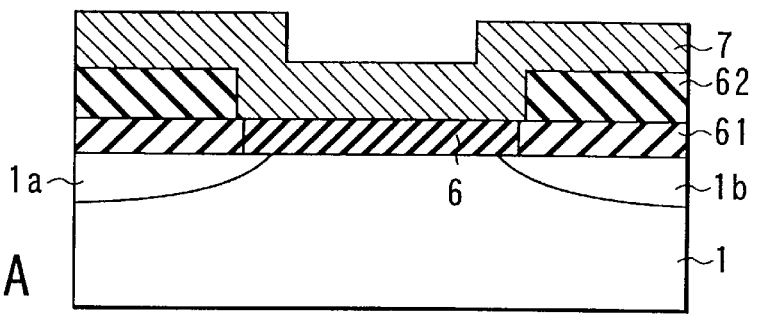
FIGS. 27A and 27B are sectional views showing the steps of a method of fabricating the semiconductor device according to the seventh embodiment.

As shown in FIG. 27A, on the entire surface of the device including a second trench formed in an insulating interlayer 62, a Pt film 7 is formed to be thin along the surface of the insulating interlayer 62, and along the shape of the bottom and side surfaces of the second trench so as to cover this second trench with a substantially uniform film thickness, by using CVD or the like.

Figure 27B:
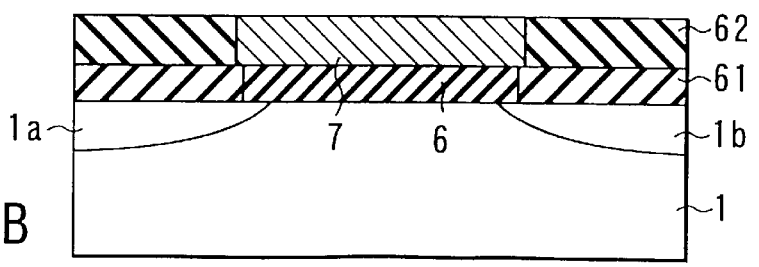

Subsequently, as shown in FIG. 27B, the upper surface of the device is planarized by using CMP. This CMP is continued until the insulating interlayer 62 is exposed, and the surface of this insulating interlayer 62 is leveled with the surface of the Pt film 7 on the second trench. The result is a structure in which the Pt film 7 is selectively buried in the insulating interlayer 62.

Furthermore, an insulating interlayer 63 is deposited on the entire device surface, and contact plugs 8a to 8c and lines 9a to 9c are formed. These steps are the same as in the fifth embodiment. As a consequence, the semiconductor device shown in FIG. 26 is obtained.

In this embodiment as described above, even a semiconductor device including a ferroelectric gate capacitor with an MFS (electrode/ferroelectric film/semiconductor) structure can achieve the same effects as the fifth embodiment.

In the fifth to seventh embodiments described above, the trench in which the dielectric film 4 alone or the dielectric film 4 and the Pt film 5 are formed is wider than the trench in which the ferroelectric film 6 is formed. However, the widths of the two trenches need only be different from each other, so the trench in which the ferroelectric film 6 is formed can be wider. Also, the trench in which the ferroelectric film 6 is formed is narrower than the trench in which the Pt film 7 is formed. However, the widths of the two trenches need only be different from each other, so the trench in which the Pt film 7 is formed can be narrower. Furthermore, although the dielectric film 4 and the Pt film 5 are formed in the same trench in the same insulating interlayer, these films can also be formed in different trenches in different insulating interlayers. If this is the case, after the dielectric film 4 is deposited and planarized, another insulating interlayer is deposited. A trench is formed in this insulating interlayer, and the Pt film 5 is deposited on the insulating interlayer including this trench. After that, the excess Pt film 5 is removed by planarization.

Eighth Embodiment

Figure 28:
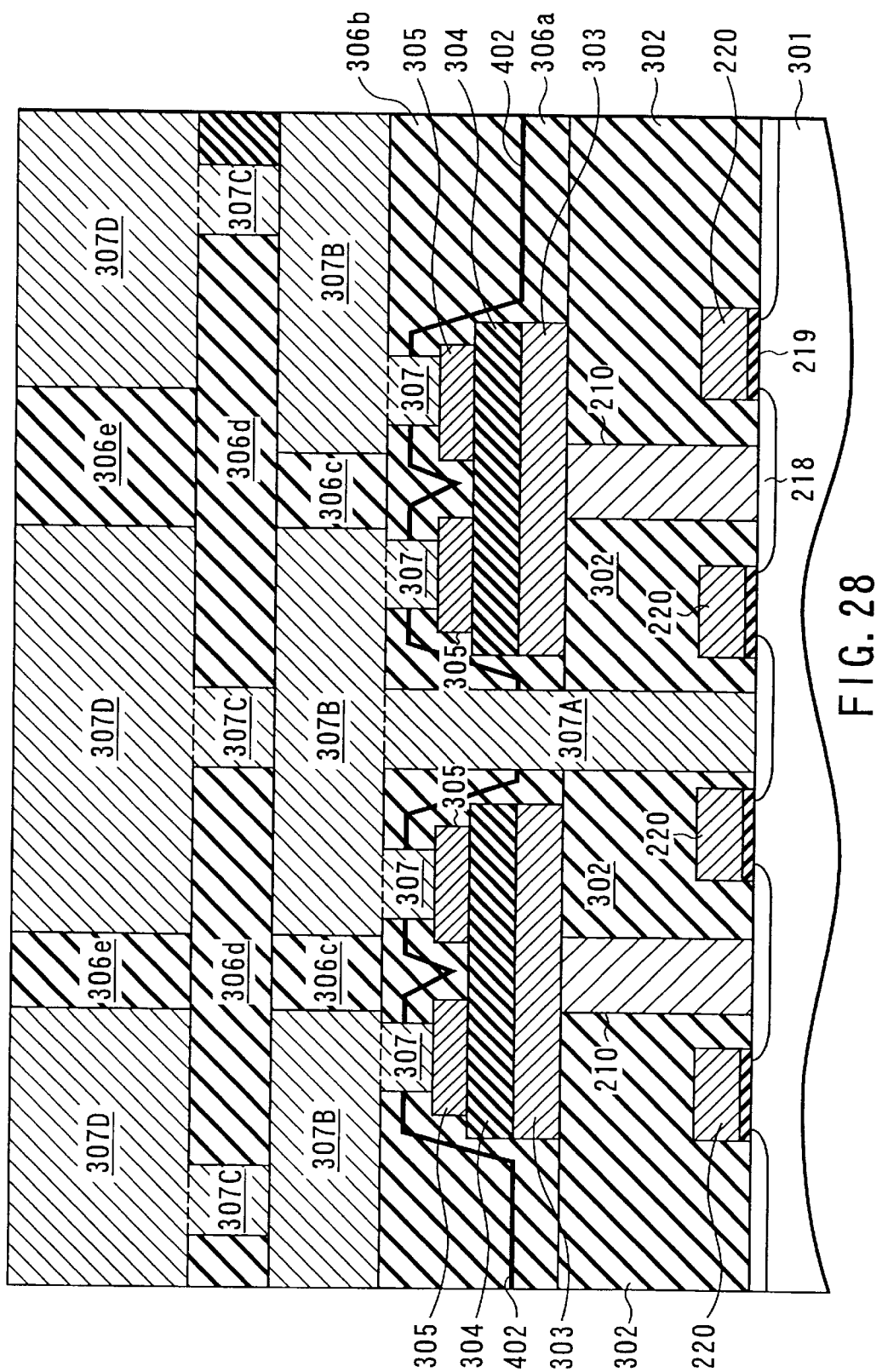
FIG. 28 is a longitudinal sectional view showing the whole construction of a semiconductor device according to the eighth embodiment of the present invention.
Figure 29:
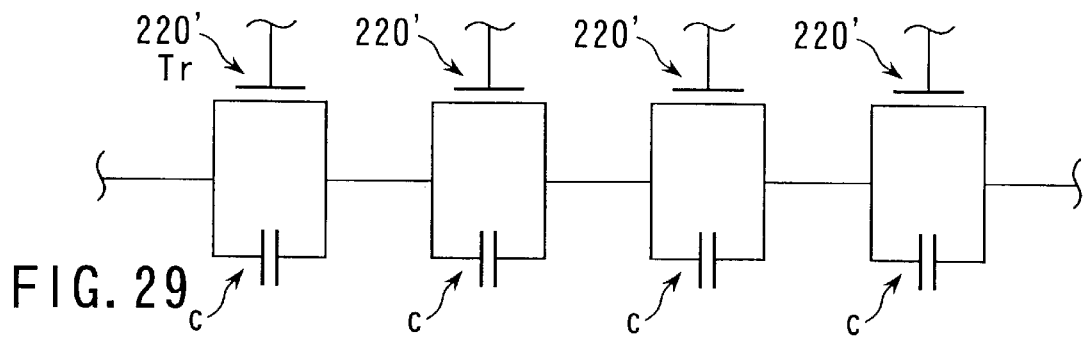
FIG. 29 is an equivalent circuit diagram of the semiconductor device according to the eighth embodiment.

FIG. 28 is a longitudinal sectional view showing the whole construction of a semiconductor device according to the eighth embodiment of the present invention. The semiconductor device of this embodiment is a "TC parallel unit series-connected ferroelectric memory" in which the two ends of a capacitor (C) are connected between source and drain layers of a cell transistor (T) to form a unit cell, and a plurality of such unit cells are connected in series. FIG. 29 is an equivalent circuit diagram of the practical example shown in FIG. 28.

As shown in FIG. 28, a plurality of gate electrodes 220 are formed on a silicon substrate 301 via a gate insulating film 219. Source/drain layers 218 are formed in the surface of the silicon substrate 301 between these gate electrodes 220, thereby forming transistors. An insulating interlayer 302 is deposited on the silicon substrate 301. Contact holes reaching the silicon substrate 301 are formed between the gate electrodes 220. Contact plugs 210 made of W or poly-Si are formed in these contact holes through the insulating interlayer 302.

On the insulating interlayer 302 including the contact plugs 210, a plurality of ferroelectric capacitors C having a stacked structure including a lower Pt electrode 303, a PZT film 304, and an upper Pt electrode 305 are selectively formed. Each ferroelectric capacitor C is formed to overlap the contact plug 210 so as to be electrically connected to the contact plug 210. A thin insulating interlayer 306a is deposited to cover these ferroelectric capacitors C. A hydrogen barrier film 402 is deposited on this insulating interlayer 306a. An insulating interlayer 306b is deposited to cover this hydrogen barrier film 402. That is, the hydrogen barrier layer 402 is interposed between the insulating interlayers 306a and 306b.

A contact hole reaching the upper Pt electrode 305 is formed in the insulating interlayers 306a and 306b on the upper Pt electrode 305. A metal is buried in this contact hole. This forms a contact plug 307 extending through the insulating interlayers 306a and 306b and the hydrogen barrier layer 402.

Two such contact plugs 307 are formed for one contact plug 210. Two upper Pt electrodes 305 are formed in one-to-one correspondence with these two contact plugs 307 to share one lower electrode 303 and one ferroelectric film 304. That is, a pair of adjacent capacitors C share the lower Pt electrode 303 and the ferroelectric film 304. Therefore, the upper Pt electrodes 305 and the contact plugs 307 are divisionally formed in one-to-one correspondence with the capacitors C. Although the lower Pt electrode 303 and the ferroelectric film 304 are shared by two capacitors C, one or both of the upper Pt electrode 303 and the ferroelectric film 304 need not be shared but can be divided in one-to-one correspondence with the capacitors C.

An insulating interlayer 306c is deposited on the insulating interlayer 306b including the contact plugs 307. Wiring trenches are selectively formed in this insulating interlayer 306c. Each wiring trench is so formed that two contact plugs 307 connected to two adjacent capacitors C are exposed. "Two adjacent capacitors" herein mentioned are two capacitors C not sharing the contact plug 210 and the lower Pt electrode 303.

In addition, a contact hole is formed in the bottom surface of this wiring trench. This contact hole reaches the silicon substrate 301 through the insulating interlayers 302, 306a, and 306b where the contact plug 307 and the capacitor C are not formed. A metal is buried in this contact hole to form a contact plug 307A. Also, a metal is buried in the wiring trenches to form lines 307B.

An insulating interlayer 306d is formed on the insulating interlayer 306c including the lines 307B. A plurality of via holes are formed in this insulating interlayer 306d to reach the lines 307B. A metal is buried in these via holes to form a plurality of via plugs 307C. These via plugs 307C are electrically connected to the lines 307B.

Furthermore, an insulating interlayer 306e is formed on the insulating interlayer 306d including the via plugs 307C. A plurality of wiring trenches are formed in this insulating interlayer 306e to reach the via plugs 307C. A metal is buried in these wiring trenches to form a plurality of lines 307D. These lines 307D are electrically connected to the via plugs 307C. Note that any number of wiring layers can be formed, i.e., via plugs can be connected to the lines 307D, lines can be formed on these via plugs, and so on.

Referring to FIG. 28, the contact plugs 210 and the contact plug 307A are electrically connected to the source/ drain layers 218 formed in the surface of the silicon substrate 301. Accordingly, the two ends of the ferroelectric capacitor C are connected to the source/drain layers 218 of the transistor.

As shown in FIG. 29, a ferroelectric memory thus formed has a structure in which a plurality of cells, each comprising a pair of a transistor 220' and the capacitor C connected in parallel, are connected in series.

A method of fabricating the semiconductor device according to this embodiment will be described below with reference to sectional views shown in FIGS. 30A to 31B.

Figure 30A:
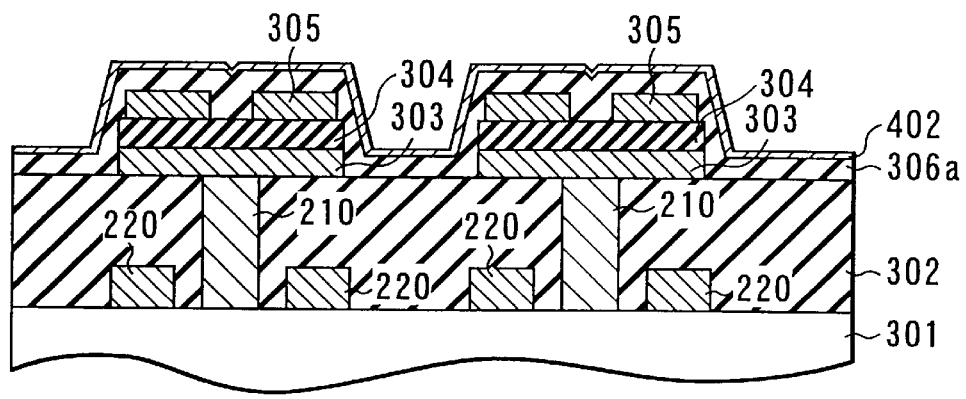
FIGS. 30A and 30B are sectional views showing the steps of a method of fabricating the semiconductor device according to the eighth embodiment.

First, as shown in FIG. 30A, a plurality of gate electrodes 220 are selectively formed on a silicon substrate 301 via a gate insulating film (not shown). An insulating interlayer 302 is deposited on the silicon substrate 301 including these gate electrodes 220. A plurality of contact holes reaching the silicon substrate 301 and not overlapping the gate electrodes 220 are formed in the insulating interlayer 302. A metal is buried in these contact holes to form a plurality of contact plugs 210. On the insulating interlayer 302 including these contact plugs 210, a lower Pt electrode 303, a PZT film 304, and an upper Pt electrode 305 are sequentially stacked.

More specifically, a lower Pt electrode 303 about 100 nm thick is deposited by sputtering. On this lower Pt electrode 303, a PZT film 304 about 150 nm thick is deposited by sputtering or a sol-gel method. The substrate is then crystallized by RTA (Rapid Thermal Annealing) in an oxygen atmosphere at 650° C. On the PZT film 304, an upper Pt electrode 305 about 50 nm thick is deposited.

These lower Pt electrode 303, PZT film 304, and upper Pt electrode 305 are etched to selectively form a plurality of capacitors C. Consequently, two capacitors C are formed for one contact plug 210.

Although not shown, a first mask material is used to etch the upper Pt electrode 305, and a second mask material larger in area than the first mask material is used to etch the PZT film 304 and the lower Pt electrode 303.

Next, an insulating interlayer 306a is deposited on the insulating interlayer 302 so as to cover these capacitors C. A hydrogen barrier film 402 is deposited on this insulating interlayer 306a.

Figure 30B:
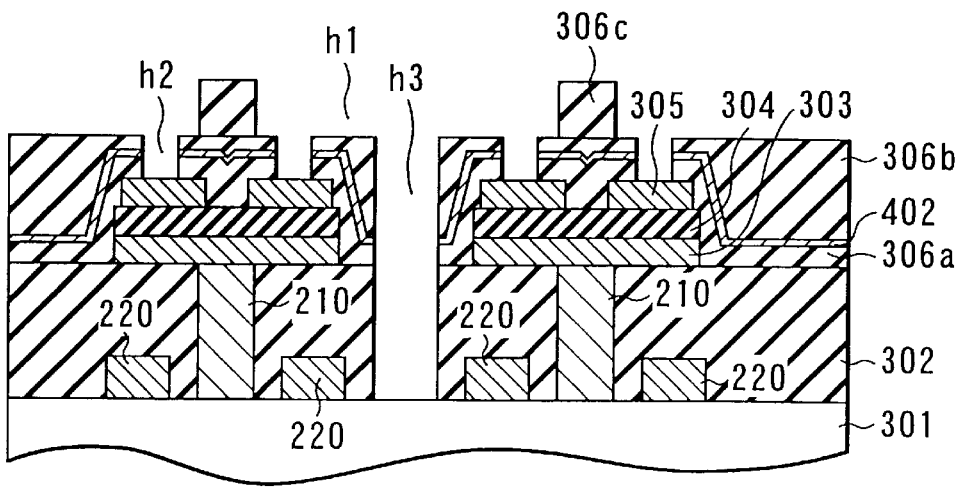

In addition, as shown in FIG. 30B, an insulating interlayer 306b is deposited on this hydrogen barrier film 402. The result is a structure in which the hydrogen barrier film 402 is interposed between the insulating interlayers 306a and 306b. An $Al_2O_3$ film is desirably used as the hydrogen barrier film 402, and a silicon oxide film is desirably used as the insulating interlayers 306a and 306b. More specifically, after the capacitors C are formed, an $SiO_2$ film (deposition temperature: 300 to 400° C.) or an ozone TEOS film (deposition temperature: 300 to 425° C.) is formed as the insulating interlayer 306a by plasma CVD. After that, annealing is preferably performed in an oxygen atmosphere at 500 to 650° C. in order to improve the capacitor characteristics. An $Al_2O_3$ film is then formed as the hydrogen barrier film 402 by sputtering. To improve the insulating properties of this $Al_2O_3$ film, annealing is desirably performed in an oxygen atmosphere at 400° C. After that, an $SiO_2$ film (deposition temperature: 300 to 400° C.) or an ozone TEOS film (deposition temperature: 300 to 425° C.) is formed at low temperature as the insulating interlayer 306b.

In this embodiment, the thickness of the insulating interlayer 306a is set to about 0.2 times to twice the sum of the film thicknesses of the upper Pt electrode 305, the PZT film 304, and the lower Pt film 303. Alternatively, the thickness of the insulating interlayer 306a is preferably 0.05 times to 3 times the thickness of the ferroelectric capacitor C. In this way, the hydrogen barrier film 402 can be deposited with high coverage.

The hydrogen barrier film 402 can also be formed in direct contact with the ferroelectric capacitor C with no insulating interlayer 306a. Even in this structure, the capacitor C has hydrogen blocking properties. However, the hydrogen barrier properties are better when the insulating interlayer 306a is formed.

If the hydrogen barrier film 402 (e.g., an $Al_2O_3$, $Al_xO_y$, $TiO_x$, or $Al_xSi_yO_z$ film) is directly deposited on the capacitor, the ferroelectric film 304 is deprived of oxygen contained therein by the hydrogen barrier film 402, leading to easy deterioration of the characteristics. This deterioration of the characteristics is temporarily recovered by oxygen annealing. However, after that, when the fabrication proceeds to a step having no oxygen annealing effect and a reducing gas such as hydrogen again reaches the hydrogen barrier film 402, a certain portion in this hydrogen barrier film 402 is reduced. The reduced element such as Al or Ti deprives the ferroelectric film 304 of oxygen to deteriorate its characteristics.

By contrast, when the insulating interlayer 306a is formed as in this embodiment, the reduced element such as Al or Ti is blocked by this insulating interlayer 306a or is reduced instead of the ferroelectric film 304. Accordingly, no deterioration of the characteristics takes place.

Note that an $Al_2O_3$ film and $Al_xO_y$ film are amorphous when formed at a temperature of 400 to 700° C. These films are excellent in trapping oxygen but are easily reduced by hydrogen and the like. From the viewpoint of coverage, versatility, convenience, and resistance to peeling on the capacitor, a silicon oxide film, nitrogen-containing silicon oxide film, or $Al_xSi_yO_z$ film is suitable as the insulating interlayer 306a. However, another material can also be used provided that the material meets these conditions.

As described above, the hydrogen barrier film 402 must be made of a material which blocks or traps hydrogen, but slight reduction is permitted. This increases the margin and improves the reliability of the device.

From the above point of view, a method of forming the insulating interlayer 306a desirably meets the following four conditions: first, an atmosphere in which hydrogen groups are not readily produced or few; second, a low temperature (favorably 400° C. or less); third, a deposited film is not unnecessarily thick (this causes deterioration by hydrogen groups during deposition and is also desirable from the viewpoint of fabrication); and four, this film thickness is 0.05 times to 3 times (both exclusive) the film thickness (the sum (including the barrier metal) of the upper electrode 305, the ferroelectric film 304, and the lower electrode 303) of the capacitor. It is of course unnecessary to satisfy all of these four conditions.

Subsequently, an insulating interlayer 306c is deposited on the insulating interlayer 306b. Wiring trenches h1 are formed in this insulating interlayer 306c. In this formation step, the hydrogen barrier film 402 functions as an etching stopper. That is, the hydrogen barrier film 402 can reliably stop etching of the insulating interlayer 306b and thereby easily and reliably prevent over-etching. Next, contact holes h2 extending from the bottom surfaces of the wiring trenches h1 to the upper Pt electrodes 305 are formed. After oxygen recovery annealing (600° C.) is performed, a contact hole h3 reaching the silicon substrate 301 is formed.

Figure 31A:
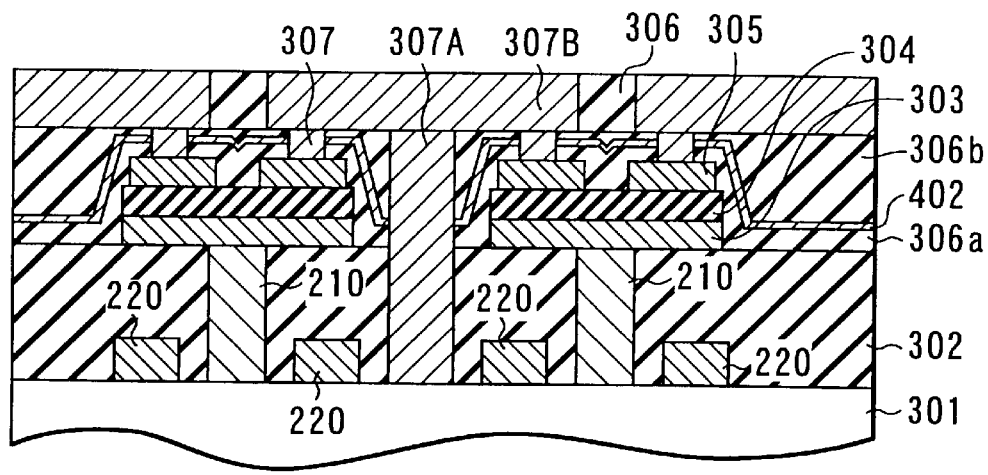
FIGS. 31A and 31B are sectional views showing the steps following FIG. 30B of the method of fabricating the semiconductor device according to the eighth embodiment.

As shown in FIG. 31A, aluminum is deposited in the contact holes h2 and h3 and the wiring trenches h1 by sputtering. After this, aluminum is buried by reflow, the surface is planarized by CMP or the like. Consequently, contact plugs 307 and 307A and lines 307B are formed. Although the contact plugs 307 and 307A and the lines 307B are formed using reflow of aluminum in this embodiment, they can also be formed by dry etching using a resist.

Figure 31B:
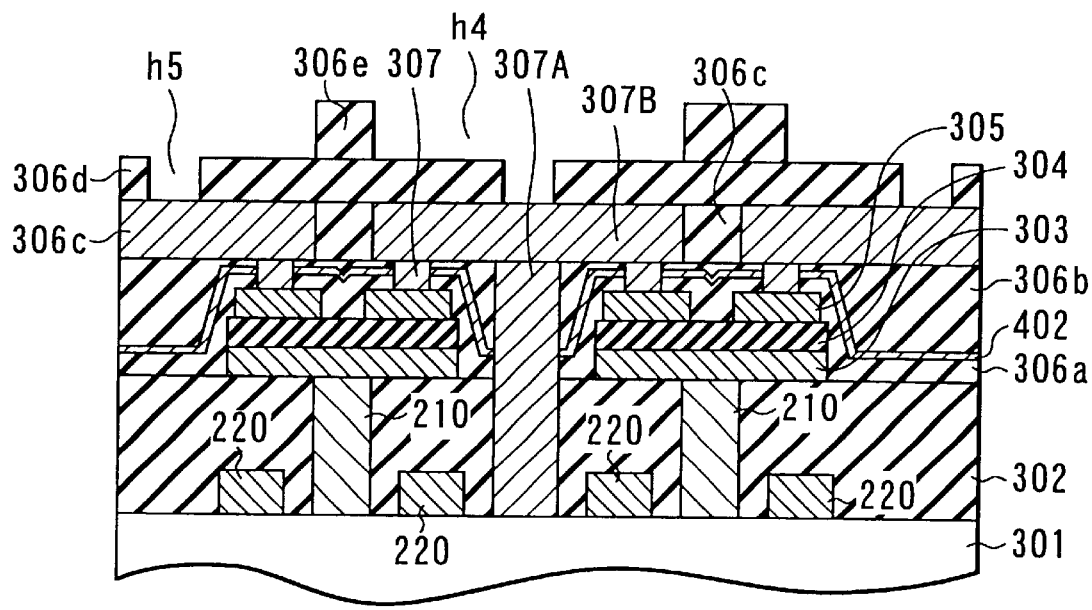

Next, as shown in FIG. 31B, insulating interlayers 306d and 306e are sequentially stacked on the insulating interlayer 306c including the lines 307B (it is of course also possible to form a single insulating interlayer instead of two layers). Similar to the wiring trenches h1 and the contact holes h2 and h3, wiring trenches h4 are formed in the insulating interlayer 306e, and via holes h5 reaching lines 307D through the insulating interlayer 306d are formed. Aluminum is deposited on these wiring trenches h4 and via holes h5 by sputtering and allowed to reflow, and the surface is planarized. Consequently, as shown in FIG. 28, the via plugs 307C and the lines 307D are formed.

In this embodiment, the hydrogen barrier film 402 is a film having a hydrogen diffusion constant of $1.0 \times 10^{-5}$ cm$^2$/s or less, preferably a metal oxide film having a specific resistance of 1 k$\Omega$-cm or more. A representative example is an aluminum oxide (Al$_2$O$_3$) film. By thus inserting the hydrogen barrier film between the insulating interlayers, deterioration of the performance of the ferroelectric capacitor is prevented. This hydrogen barrier film between the insulating interlayers also suppresses damage to the ferroelectric capacitor in the step of depositing a passivation film (usually an SiN film) which finally covers the upper surface of the element. Furthermore, the insulating interlayer 306a has a function of preventing a reaction caused when the hydrogen barrier film and the ferroelectric capacitor C come in direct contact with each other.

In addition, it is possible to obtain the effect of the PZT film to prevent Pb diffusion and the effect of preventing Ti diffusion to the PZT film resulting from nonuse of Ti. Also, an Al$_2$O$_3$ film need not be removed by patterning since this film is an insulating film. Accordingly, even when this Al$_2$O$_3$ film is inserted all over the surface in the entire insulating interlayer, a short circuit of a contact to a diffusion layer and the like do not occur. Furthermore, by forming the hydrogen barrier film via one insulating interlayer, the stress relaxing effect of this hydrogen barrier film can be obtained.

In this embodiment, the hydrogen barrier film 402 functions as an etching stopper when the wiring trenches h1 and h4 are formed by etching. As a consequence, the depths of these wiring trenches h1 and h4 can be readily and dependably controlled. This allows reliable control of the layer thicknesses of the lines 307B and 307D.

In this embodiment, the hydrogen barrier film can be made of a material selected from the group consisting of Al$_x$O$_y$ represented by Al$_2$O$_3$, Al$_x$Si$_y$O$_z$, TiO$_x$, ZrO$_x$, MgO$_x$, and MgTiO$_x$.

Ninth Embodiment

Figure 32:
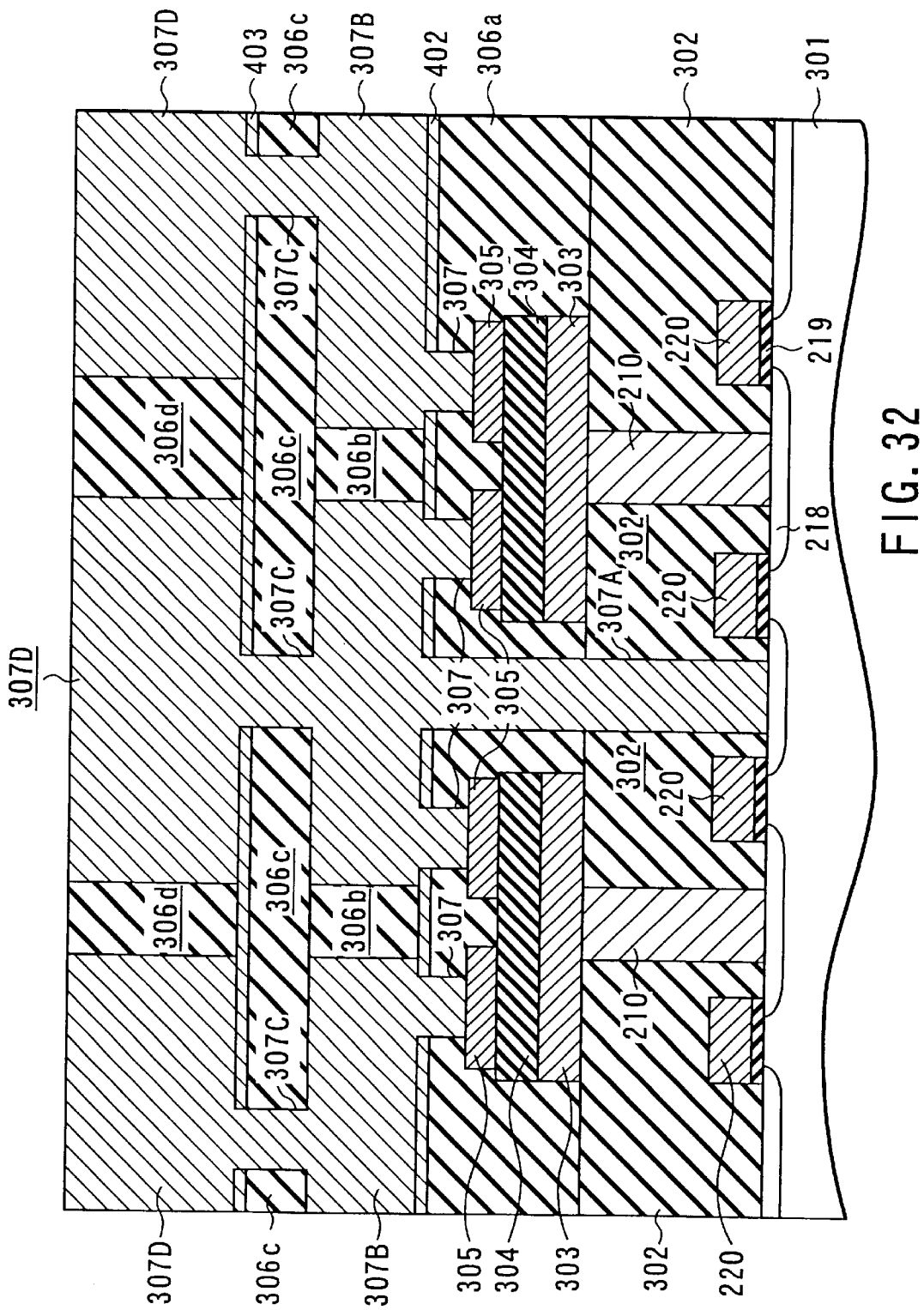
FIG. 32 is a longitudinal sectional view showing the whole construction of a semiconductor device according to the ninth embodiment of the present invention.

FIG. 32 is a longitudinal sectional view showing the whole construction of a semiconductor device according to the ninth embodiment of the present invention. In the semiconductor device of this embodiment, the present invention is applied to a "TC parallel unit series-connected ferroelectric memory" as in the eighth embodiment.

A method of fabricating the semiconductor device shown in FIG. 32 will be described below with reference to sectional views shown in FIGS. 33A to 35B.

First, as shown in the lower portion of FIG. 32, gate electrodes 220 are formed on a silicon substrate 301 via a gate insulating film 219, and source/drain layers 218 are formed in the surface of the silicon substrate 301. In this manner, transistors are formed in the silicon substrate 301.

Figure 33A:
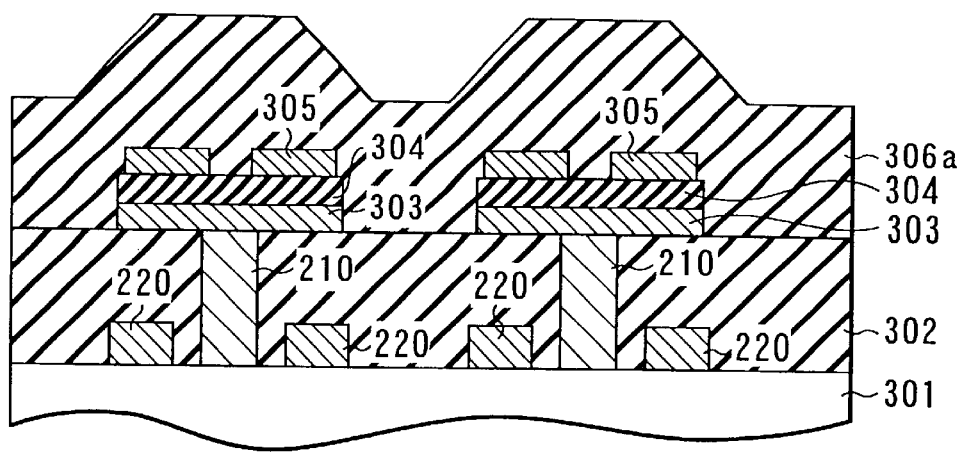
FIGS. 33A, 33B, and 33C are sectional views showing the steps of a method of fabricating the semiconductor device according to the ninth embodiment.

Next, as shown in FIG. 33A, an insulating interlayer 302 is deposited on the silicon substrate 301 including the gate electrodes 220. Also, contact holes are formed, and poly-Si or tungsten (W) is buried to form contact plugs 210. A lower Pt electrode 303, a PZT film 304, and an upper Pt electrode 305 are formed and patterned, and an insulating interlayer 306a is deposited on them.

Figure 33B:
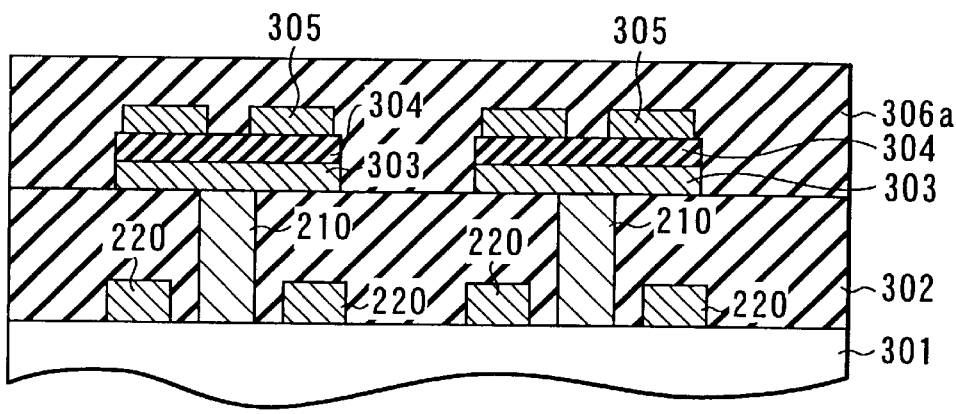
Figure 33C:
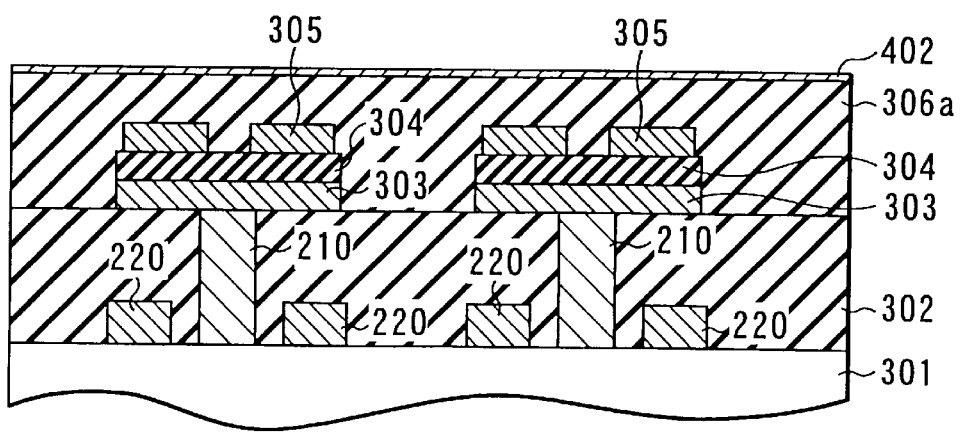
Figure 34A:
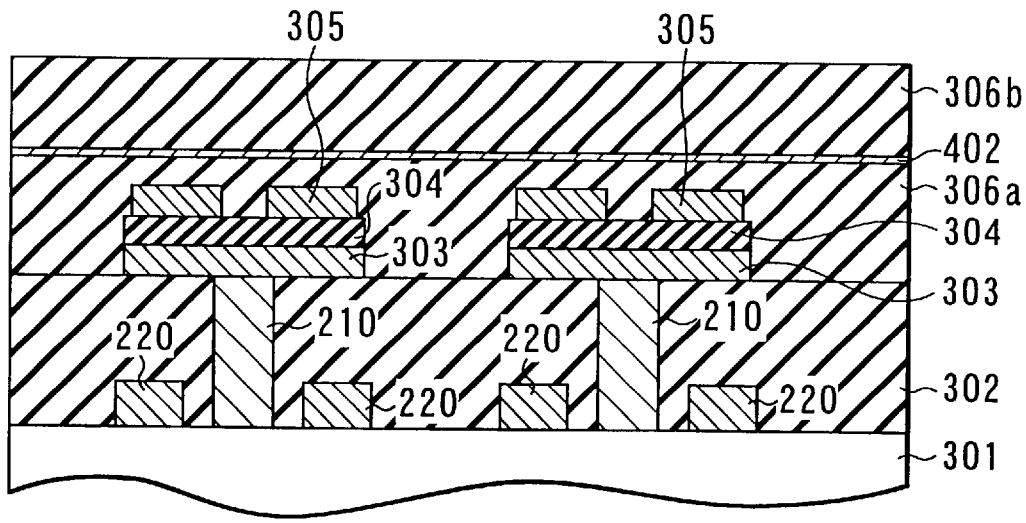
FIGS. 34A and 34B are sectional views showing the steps following FIG. 33C of the method of fabricating the semiconductor device according to the ninth embodiment.

As shown in FIG. 33B, the insulating interlayer 306a is planarized. As shown in FIG. 33C, a hydrogen barrier film 402 is formed. In addition, as shown in FIG. 34A, an insulating interlayer 306b is deposited on this hydrogen barrier film 402.

Figure 34B:
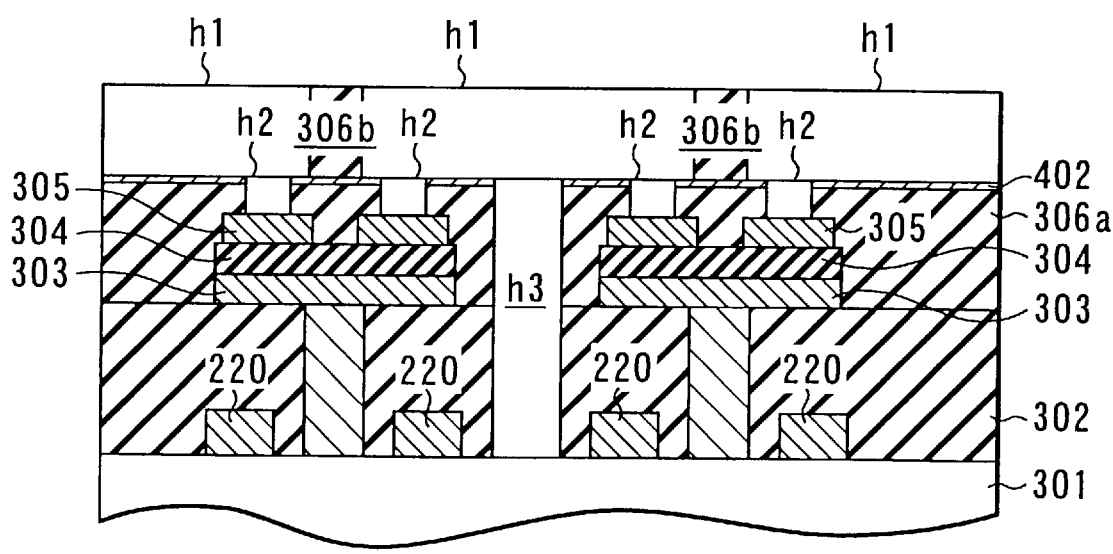

As shown in FIG. 34B, wiring trenches h1 are formed in the insulating interlayer 306b. In this formation step, the hydrogen barrier film 402 functions as an etching stopper. That is, the hydrogen barrier film 402 can reliably stop etching of the insulating interlayer 306b and thereby easily and dependably prevent over-etching. Next, contact holes h2 extending from the bottom surfaces of the wiring trenches h1 to the upper Pt electrodes 305 are formed. After oxygen recovery annealing (600° C.) is performed, a contact hole h3 reaching the silicon substrate 301 is formed.

Figure 35A:
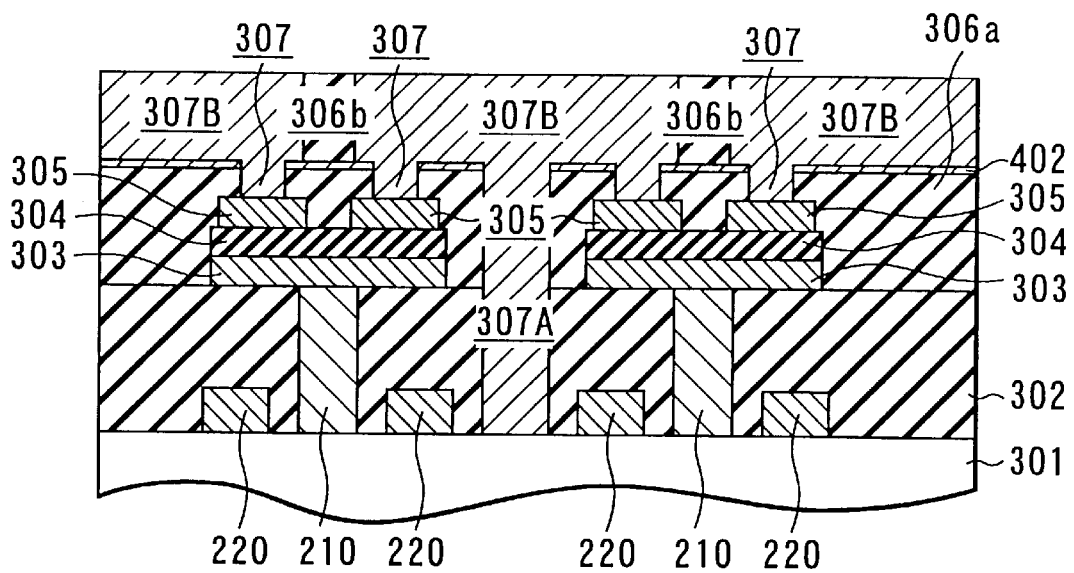
FIGS. 35A and 35B are sectional views showing the steps following FIG. 34B of the method of fabricating the semiconductor device according to the ninth embodiment.

As shown in FIG. 35A, aluminum is deposited in the contact holes h2 and h3 and the wiring trenches h1 by sputtering. After this, aluminum is buried by reflow, the surface is planarized by CMP or the like. Consequently, contact plugs 307 and 307A and lines 307B are formed.

Figure 35B:
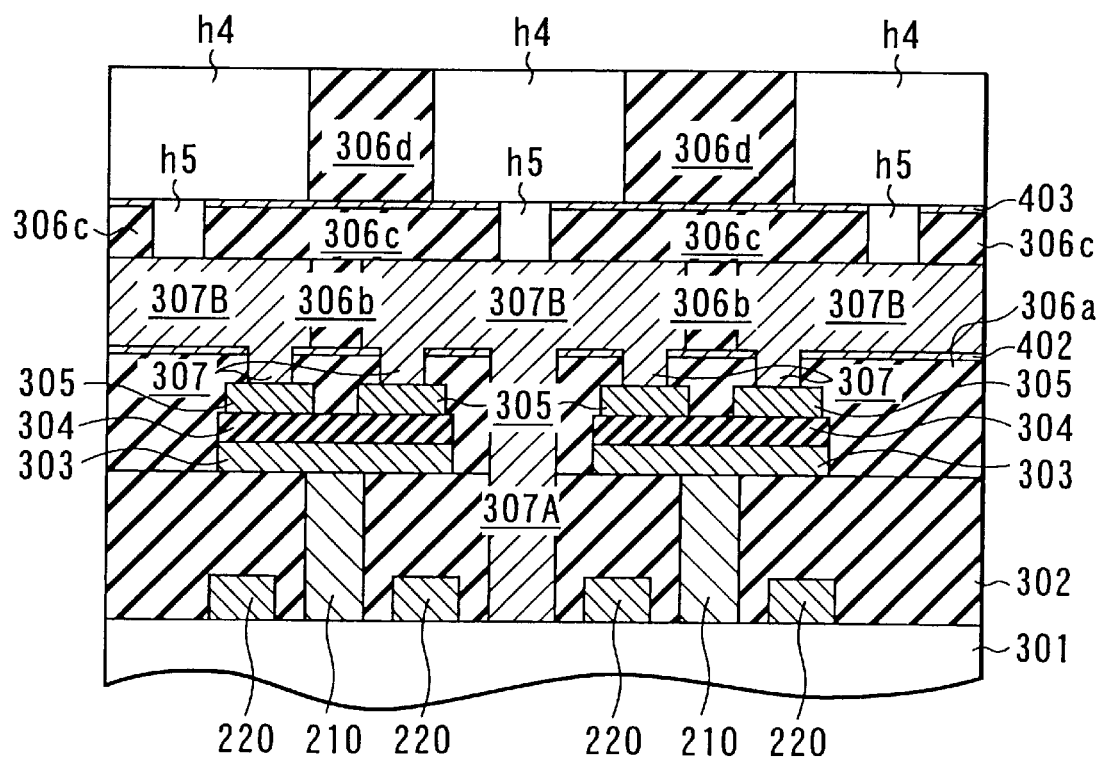

Next, as shown in FIG. 35B, an insulating interlayer 306c, a hydrogen barrier layer 403, and an insulating interlayer 306d are sequentially stacked. Wiring trenches h4 are formed in the insulating interlayer 306d. In this formation step, the hydrogen barrier film 403 functions as an etching stopper. That is, the hydrogen barrier film 403 can reliably stop etching of the insulating interlayer 306d and thereby easily and reliably prevent over-etching. Then, via holes h5 are formed in the bottom surfaces of the wiring trenches h4.

Aluminum is deposited by sputtering and allowed to reflow, and the surface is planarized. Consequently, via plugs 307C and lines 307D made of aluminum are formed. In this way, the semiconductor device shown in FIG. 32 is completed.

In this embodiment as described above, the hydrogen barrier films 402 and 403 function as etching stoppers when the wiring trenches h1 and h4 are formed by etching. As a consequence, the depths of these wiring trenches h1 and h4 can be readily and dependably controlled. This allows reliable control of the layer thicknesses of the lines 307B and 307D.

Figure 36:
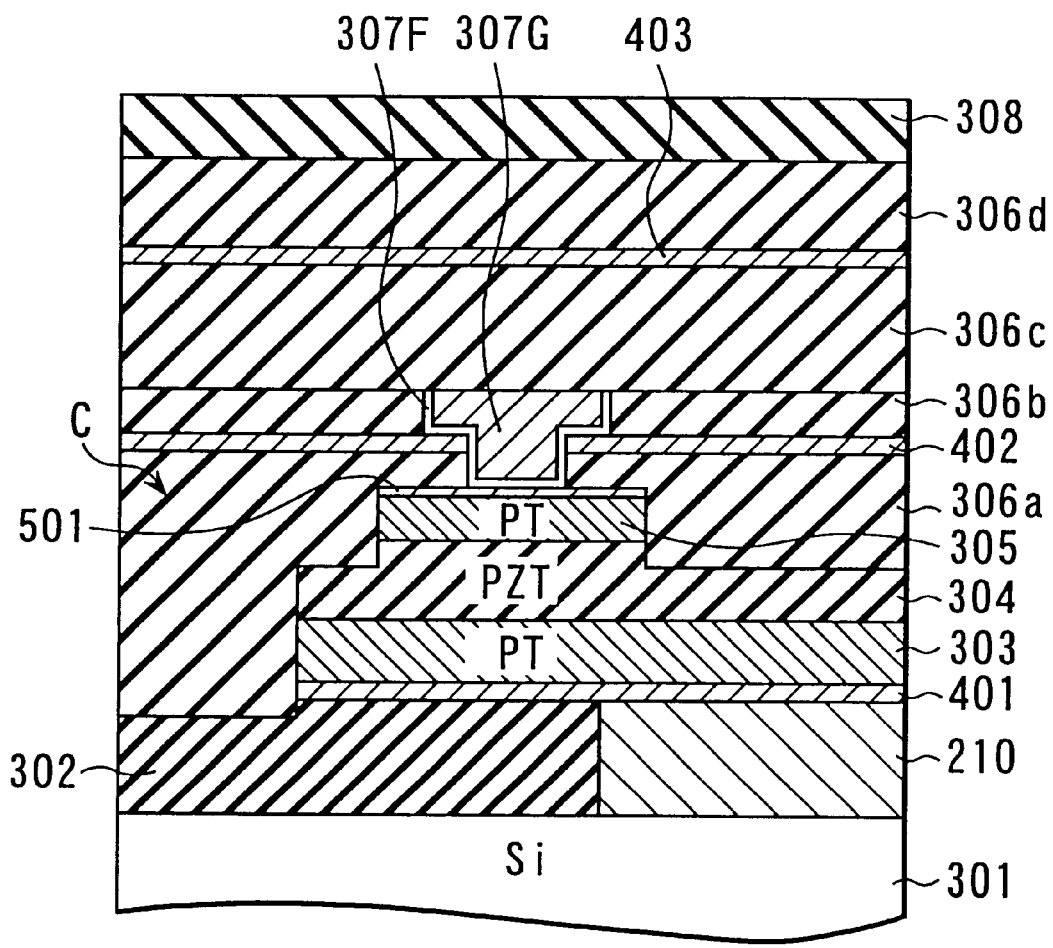
FIG. 36 is a view showing, in enlarged scale, a capacitor and its vicinity of a semiconductor device according to a modification of the ninth embodiment.

A modification of this embodiment is shown in FIG. 36. FIG. 36 is an enlarged view showing a ferroelectric capacitor C and its vicinity of the arrangement shown in FIG. 32. To illustrate the construction in more detail, in FIG. 36, an adhesive layer 401 is interposed between the lower Pt electrode 303 and the underlying insulating interlayer 302 or the contact plug 210.

FIG. 36 differs from the arrangement shown in FIG. 32 in that a titanium compound film 501 is stacked on the capacitor C, and an aluminum line 307G is formed on this titanium compound film 501 via a barrier metal 307F by deposition and planarization. In this structure, the titanium compound film 501 can be formed by, e.g., TiO$_2$ (or TiO$_x$). The barrier metal 307F can be formed by, e.g., titanium nitride (TiN$_x$) or tungsten nitride (WN$_x$).

This structure shown in FIG. 36 can prevent "peeling" of the insulating interlayer 306a on the upper Pt electrode 305. Even when an Al$_2$O$_3$ hydrogen barrier film is directly stacked on the upper Pt electrode 305, unlike the structure shown in FIG. 36, "peeling" between the upper Pt electrode 305 and the hydrogen barrier film can be prevented.

Furthermore, the titanium compound layer 501 can suppress the alloying reaction between the upper Pt electrode 305 made of platinum or the like and the aluminum line 307G. This structure is especially advantageous when an aluminum reflow line is used. This is so because the substrate is heated when a reflow line is formed, and so "peeling" between the upper Pt electrode 305 and the insulating interlayer 306a or alloying between the upper Pt electrode 305 and the aluminum line 307G readily occurs.

This titanium compound film 501 shown in FIG. 36 can also be similarly formed in the structure shown in FIG. 32 to achieve the same effect. That is, in the structure shown in FIG. 32, the titanium compound film 501 is formed between the upper Pt electrode 305 and the line 307G. This can effectively suppress "peeling" between the upper Pt electrode 305 and the insulating interlayer 306a and alloying between the upper Pt electrode 305 and the line 307G. Accordingly, this arrangement is particularly advantageous in a ferroelectric memory using an aluminum reflow line.

10th Embodiment

Figure 37:
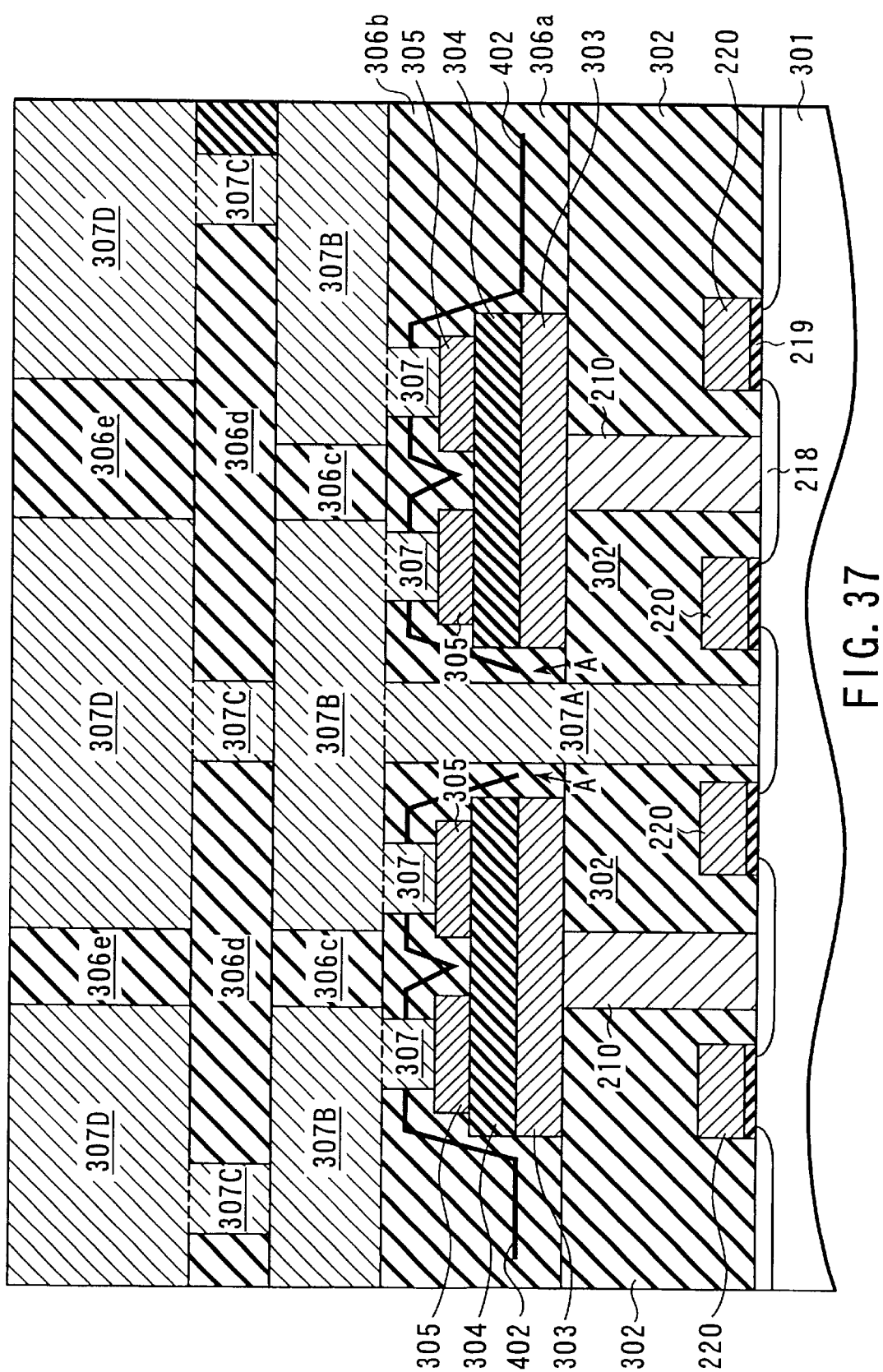
FIG. 37 is a longitudinal sectional view showing the whole construction of a semiconductor device according to the 10th embodiment of the present invention.

This embodiment relates to a modification of the eighth embodiment. FIG. 37 is a longitudinal sectional view showing the whole construction of a semiconductor device according to the 10th embodiment of the present invention. In the semiconductor device of this embodiment, the present invention is applied to a "TC parallel unit series-connected ferroelectric memory" as in the eighth embodiment.

In this semiconductor device shown in FIG. 37, as indicated by an arrow A, a hydrogen barrier film 402 is removed near a contact plug 307A to form a hole. This hole facilitates the formation of a contact hole for forming the contact plug 307A. That is, the contact hole for forming the contact plug 307A need not be extended through the hydrogen barrier film 402, and this makes etching easy.

Also, when the hole is formed in the hydrogen barrier film 402, hydrogen annealing of a transistor can be reliably performed. That is, to ensure the characteristics of a transistor having a gate electrode 220, annealing is desirably performed in a hydrogen atmosphere. However, if the hydrogen barrier film 402 blocks a portion above the transistor, i.e., a portion above the gate electrode 220, hydrogen cannot diffuse to the transistor, so no annealing effect can be obtained. In contrast, when the hole is formed in the hydrogen barrier film 402 as shown in FIG. 37, hydrogen reaches the transistor through this hole, and the hydrogen annealing effect can be dependably obtained.

Furthermore, when the titanium compound film 501 as shown in FIG. 36 is formed in the structure shown in FIG. 37, the same effect as in the arrangement shown in FIG. 36 can be obtained. That is, in the structure shown in FIG. 37, a titanium compound film (not shown) is formed between an upper Pt electrode 305 and a contact plug 307. This can effectively suppress "peeling" between the upper Pt electrode 305 and an insulating interlayer 306a and alloying between the upper Pt electrode 305 and the contact plug 307. Accordingly, this arrangement is particularly advantageous in a ferroelectric memory using an aluminum reflow line.

11th Embodiment

Figure 38:
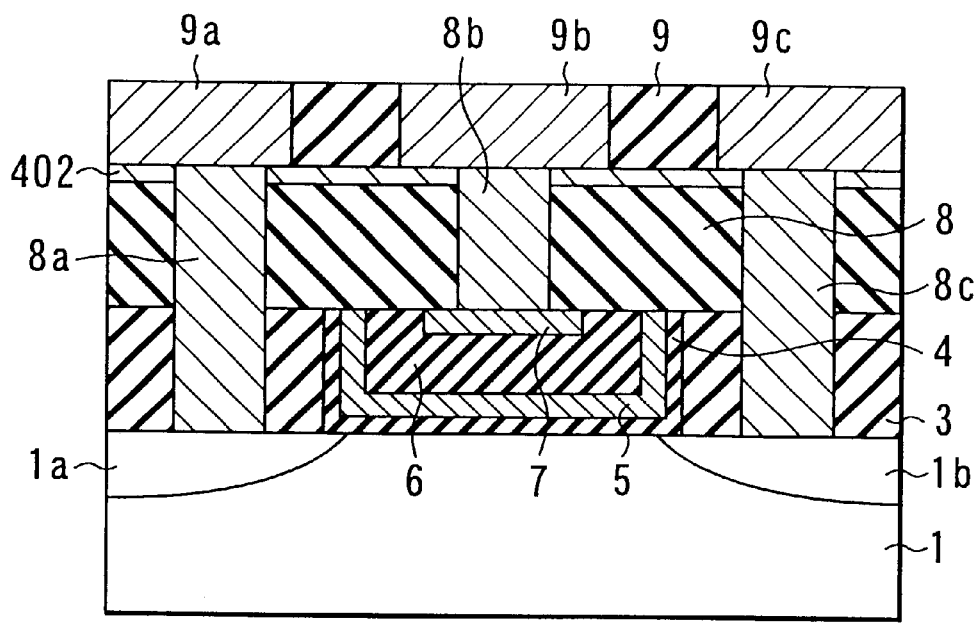
FIG. 38 is a longitudinal sectional view showing the whole construction of a semiconductor device according to the 11th embodiment of the present invention.

This embodiment relates to a modification of the first embodiment. FIG. 38 is a sectional view showing the whole construction of a semiconductor device according to this embodiment. In this embodiment, after an insulating interlayer 8 of the first embodiment is deposited, a hydrogen barrier film 402 is formed, and an insulating interlayer 9 is formed. The hydrogen barrier film 402 is formed by the same method as in the ninth embodiment. Since this hydrogen barrier film 402 functions as an etching stopper for wiring trenches formed by etching in the formation of lines 9a to 9c, the depths of these wiring trenches can be readily and reliably controlled. This can permit easy and reliable control of the layer thicknesses of the lines 9a to 9c. Also, similar to the effect of the formation of the hydrogen barrier film 402 described in the eighth embodiment, the effect of suppressing damage in the multiple layer formation process can be obtained. Although this embodiment is explained as a modification of the first embodiment, the same effects as in this embodiment can also be achieved by forming the hydrogen barrier film 402 in the second to fourth embodiments.

12th Embodiment

Figure 39:
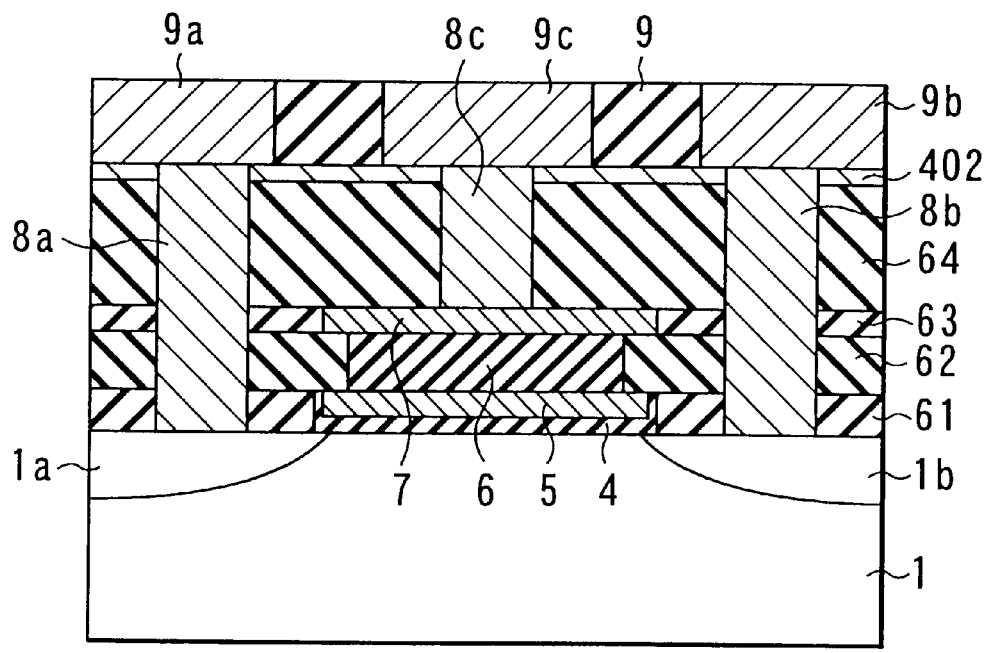
FIG. 39 is a longitudinal sectional view showing the whole construction of a semiconductor device according to the 12th embodiment of the present invention.
Figure 40A:
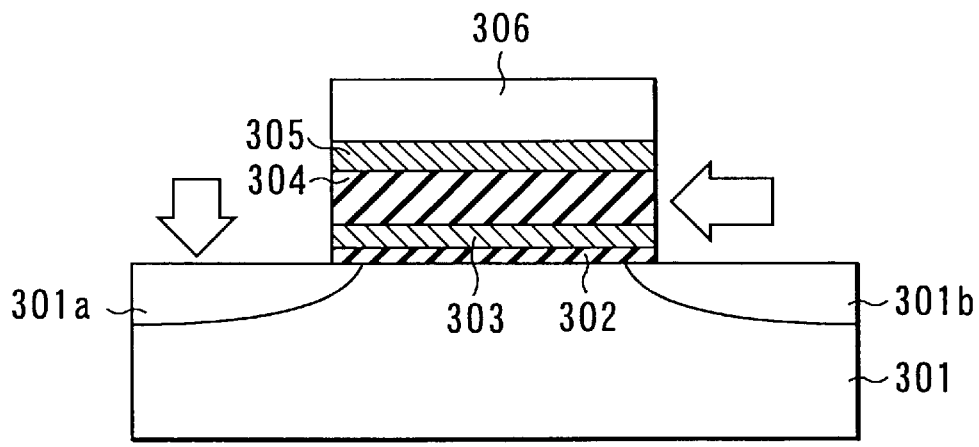
FIGS. 40A and 40B are sectional views for explaining problems of a conventional semiconductor device fabrication method.
Figure 40B:
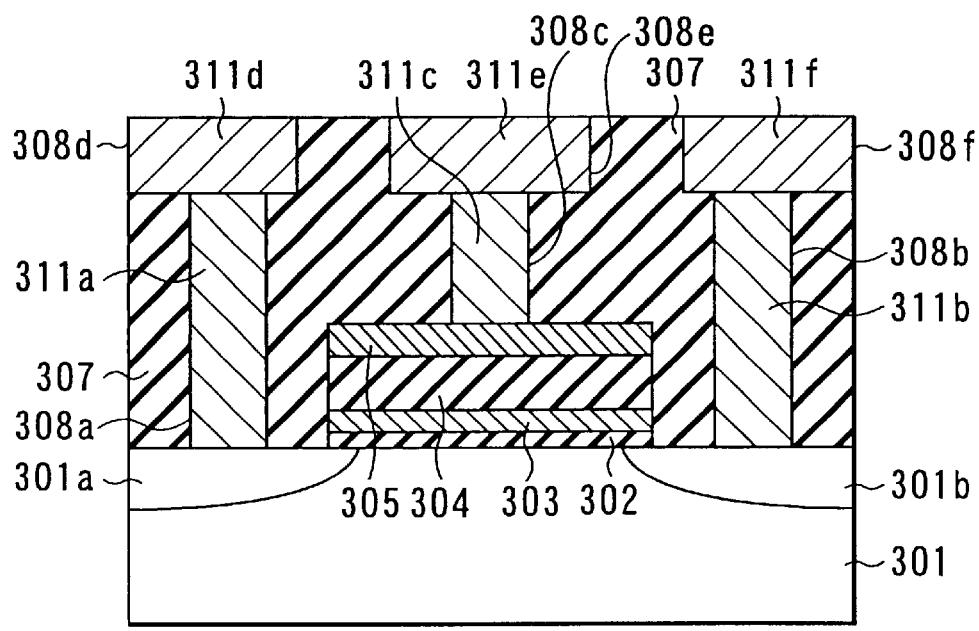

This embodiment relates to a modification of the fifth embodiment. FIG. 39 is a sectional view showing the whole construction of a semiconductor device according to this embodiment. In this embodiment, after an insulating interlayer 64 of the fifth embodiment is deposited, a hydrogen barrier film 402 is formed, and an insulating interlayer 9 is formed. The hydrogen barrier film 402 is formed by the same method as in the ninth embodiment. Consequently, the same effects as described in the 11th embodiment can be obtained. Although this embodiment is explained as a modification of the fifth embodiment, the same effects as in this embodiment can also be achieved by forming the hydrogen barrier film 402 in the sixth and seventh embodiments.

The present invention is not restricted to the above embodiments. Although a stacked structure of poly-Si and SiN is used as a dummy gate, this dummy gate is favorably made of a material containing at least one of a silicon oxide film, polysilicon, silicon nitride, $W_xSi_y$, $Ti_xSi_y$, and $Co_xSi_y$.

In addition, the lower and upper electrodes forming the ferroelectric gate capacitor structure are made of the same material. However, a stacked structure of a plurality of different materials can also be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory including a ferroelectric gate capacitor structure, comprising:

a semiconductor substrate;

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer including a hole at a position corresponding to said channel region, and said hole extending across said channel region in said channel length direction;

a capacitor insulating film comprising a ferroelectric film and formed to cover bottom and side surfaces of said hole, said capacitor insulating film including a first recess at a position corresponding to said channel region;

an upper electrode embedded in said first recess; and a conductive contact plug electrically connected to the upper electrode, said contact plug having a central portion disposed in contact with an upper surface of said upper electrode, and an extending portion extending beyond opposite ends of said upper electrode in said channel length direction, said extending portion being disposed in contact with an upper surface of said capacitor insulating film around said upper surface of said upper electrode.

2. The memory according to claim 1, wherein said bottom surface of said hole is defined by said surface of said substrate.

3. The memory according to claim 1, further comprising a dielectric film formed between said substrate and said capacitor insulating film to cover said bottom surface of said hole, wherein said dielectric film is formed to cover said bottom and side surfaces of said hole.

4. The memory according to claim 3, further comprising a lower electrode formed between said dielectric film and said capacitor insulating film to cover said bottom surface of said hole, wherein said lower electrode is formed to cover said bottom and side surfaces of said hole.

5. The memory according to claim 1, wherein said upper electrode includes a second recess for receiving said contact plug.

6. The memory according to claim 5, wherein said contact plug is in contact with bottom and side surfaces of said second recess in said upper electrode.

7. The device according to claim 1, wherein said upper surface of said upper electrode is flat and leveled with the upper surface of said capacitor insulating film.

8. A semiconductor memory including a ferroelectric gate capacitor structure, comprising:

a semiconductor substrate;

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer includinq a hole at a position corresponding to said channel region, and said hole extending across said channel region in said channel length direction;

a capacitor insulating film comprising a ferroelectric film and formed to cover bottom and side surfaces of said hole, said capacitor insulating film including a first recess at a position corresponding to said channel region;

an upper electrode embedded in said first recess;

a wiring layer formed above said capacitor insulating film and said upper electrode; and a hydrogen barrier layer interposed between said capacitor insulating film and said wiring layer, and between said upper electrode and said wiring layer.

9. The memory according to claim 8, wherein said hydrogen barrier layer comprises a material selected from the group consisting of $Al_xO_y$, $Al_xSi_yO_z$, $TiO_x$, $ZrO_x$, $MgO_x$, and $MgTiO_x$.

10. The memory according to claim 8, further comprising another insulating interlayer formed between said capacitor insulating film and said hydrogen barrier layer, and between said upper electrode and said hydrogen barrier layer.

11. A semiconductor memory including a ferroelectric gate capacitor structure, comprising:

a semiconductor substrate;

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer including a hole at a position corresponding to said channel region, and said hole extending across said channel region in said channel length direction;

a capacitor insulating film comprising a ferroelectric film formed to cover a bottom surface of said hole and contact side surfaces of said hole, said capacitor insulating film being disposed in contact with said channel region of said substrate; and an upper electrode formed to cover said capacitor insulating film in said hole and contact said side surfaces of said hole, wherein said capacitor insulating film and said upper electrode have different lengths in said channel length direction, and first and second portions of said hole on the same level as said capacitor insulating film and said upper electrode have different lengths in said channel length direction.

12. The memory according to claim 11, wherein said first and second portions of said hole are formed in first and second portions, respectively, of said insulating interlayer formed in different steps.

13. The memory according to claim 11, wherein said upper electrode has a larger length than that of said capacitor insulating film in said channel length direction.

14. A method of fabricating a semiconductor memory including a ferroelectric gate capacitor structure, comprising:

forming a source layer and a drain layer in a surface of a semiconductor substrate, said source layer and said drain layer opposing each other in a channel length direction with a channel region in said surface of said substrate interposed therebetween;

forming, on said surface of said substrate, an insulating interlayer extending from said source layer to said drain layer and including a hole at a position corresponding to said channel region, said hole extending across said channel region in said channel length direction;

sequentially stacking a dielectric film, a capacitor insulating film comprising a ferroelectric film, and an upper electrode film on said insulating interlayer to cover bottom and side surfaces of said hole;

removing portions of said dielectric film, said capacitor insulating film, and said upper electrode film on said insulating interlayer by planarization;

forming a sacrificial structure at a position on said substrate corresponding to said channel region;

forming said source layer and said drain layer by implanting impurity ions into said surface of said substrate by using said sacrificial structure as a mask;

forming said insulating interlayer on said substrate to surround said sacrificial structure; and forming said hole in said insulating interlayer by removing said sacrificial structure by etching.

15. The method according to claim 14, further comprising forming a lower electrode film between said dielectric film and said ferroelectric film by deposition, to cover said bottom and side surfaces of said hole.

16. The method according to claim 14, wherein said bottom surface of said hole is defined by said surface of said substrate.

17. A method of fabricating a semiconductor memory including a ferroelectric gate capacitor structure, comprising:

forming a source layer and a drain layer in a surface of a semiconductor substrate, said source layer and said drain layer opposing each other in a channel length direction with a channel region in said surface of said substrate interposed therebetween;

forming, on or above the surface of said substrate, a first insulating interlayer extending from said source layer to said drain layer and including a first recess at a position corresponding to said channel region;

stacking a capacitor insulating film comprising a ferroelectric film on said first insulating interlayer to cover bottom and side surfaces of said first recess;

removing a portion of said capacitor insulating film on said first insulating interlayer by planarization, thereby leaving said capacitor insulating film in said first recess;

forming, on said first insulating interlayer and said capacitor insulating film, a second insulating interlayer including a second recess at a position corresponding to said channel region and exposing said capacitor insulating film, said first and second recesses having different lengths in said channel length direction;

depositing an upper electrode film on said second insulating interlayer to cover bottom and side surfaces of said second recess;

removing a portion of said upper electrode film on said second insulating interlayer by planarization;

forming a sacrificial structure at a position on said substrate corresponding to said channel region;

forming said source layer and said drain layer by implanting impurity ions into said surface of said substrate by using said sacrificial structure as a mask;

forming a lowermost insulating interlayer on said substrate to surround said sacrificial structure; and forming a lowermost hole in said lowermost insulating interlayer by removing said sacrificial structure by etching.

18. The method according to claim 17, further comprising, before said first insulating interlayer is formed:

forming, on the surface of said substrate, a third insulating interlayer extending from said source layer to said drain layer and including a third recess at a position corresponding to said channel region;

depositing a dielectric film on said third insulating interlayer to cover bottom and side surfaces of said third recess; and removing a portion of said dielectric film on said third insulating interlayer by planarization, thereby leaving said dielectric film in said third recess, wherein said lowermost insulating interlayer and said lowermost hole are said third insulating interlayer and said third recess, respectively, and said first insulating interlayer is formed on said third insulating interlayer.

19. The method according to claim 18, wherein said third recess has a length different from that of said first recess in said channel length direction.

20. The method according to claim 17, further comprising, before said first insulating interlayer is formed:

forming, on the surface of said substrate, a third insulating interlayer extending from said source layer to said drain layer and including a third recess at a position corresponding to said channel region;

forming a dielectric film and a lower electrode film in this order on said third insulating interlayer by deposition, to cover said bottom and side surfaces of said third recess; and removing portions of said dielectric film and said lower electrode film on said third insulating interlayer by planarization, wherein said lowermost insulating interlayer and said lowermost hole are said third insulating interlayer and said third recess, respectively, and said first insulating interlayer is formed on said third insulating interlayer.

21. The method according to claim 20, wherein said third recess has a length different from that of said first recess in said channel length direction.

22. A semiconductor memory including a ferroelectric gate capacitor structure, comprising:

a semiconductor substrate;

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer including a hole at a position corresponding to said channel region, and said hole extending across said channel region in said channel length direction;

a capacitor insulating film comprising a ferroelectric film and formed to cover bottom and side surfaces of said hole, said capacitor insulating film including a first recess at a position corresponding to said channel region;

an upper electrode embedded in said first recess, said upper electrode having an upper surface, which is flat and leveled with an upper surface of said capacitor insulating film and an upper surface of said insulating interlayer therearound; and a conductive contact plug disposed in contact with said upper surface of said upper electrode.

23. The memory according to claim 22, wherein said bottom surface of said hole is defined by said surface of said substrate.

24. The memory according to claim 22, further comprising a dielectric film formed between said substrate and said capacitor insulating film to cover said bottom surface of said hole, wherein said dielectric film is formed to cover said bottom and side surfaces of said hole.

25. The memory according to claim 24, further comprising a lower electrode formed between said dielectric film and said capacitor insulating film to cover said bottom surface of said hole, wherein said lower electrode is formed to cover said bottom and side surfaces of said hole.

26. A semiconductor memory including a ferroelectric gate capacitor structure, comprising:

a semiconductor substrate;

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer including a hole at a position corresponding to said channel region, and said hole extending across said channel region in said channel length direction;

a capacitor insulating film comprising a ferroelectric film formed to cover a bottom surface of said hole and contact side surfaces of said hole; and an upper electrode formed to cover said capacitor insulating film in said hole and contact said side surfaces of said hole;

a dielectric film formed between said substrate and said capacitor insulating film to cover the bottom surface of said hole, said dielectric film being disposed in contact with said channel region of said substrate, wherein said capacitor insulating film and said upper electrode have different lengths in said channel length direction, and first and second portions of said hole on the same level as said capacitor insulating film and said upper electrode have different lengths in said channel length direction.

27. The memory according to claim 26, wherein said dielectric film has a length different from that of said capacitor insulating film in said channel length direction.

28. The memory according to claim 26, further comprising a lower electrode formed between said dielectric film and said capacitor insulating film to cover said bottom surface of said hole.

29. The memory according to claim 28, wherein said dielectric film includes a recess at a position corresponding to said channel region, and said lower electrode is formed to cover bottom and side surfaces of said recess.

30. The memory according to claim 27, said dielectric film has a larger length than that of said capacitor insulating film in said channel length direction.

31. The memory according to claim 30, wherein said upper electrode has a larger length than that of said capacitor insulating film in said channel length direction.

32. The memory according to claim 26, wherein said first and second portions of said hole are formed in first and second portions, respectively, of said insulating interlayer formed in different steps.

33. The memory according to claim 26, wherein said upper electrode has a larger length than that of said capacitor insulating film in said channel length direction.

34. A semiconductor memory comprising a first transistor including a ferroelectric gate capacitor structure, and a second transistor functioning as a switching transistor, both formed on a semiconductor substrate, wherein said first transistor comprises:

a source layer and a drain layer formed in a surface of said substrate, said source layer and said drain layer opposing each other in a channel length direction with a channel region in the surface of said substrate interposed therebetween;

an insulating interlayer formed on said surface of said substrate to extend from said source layer to said drain layer, said insulating interlayer including a hole at a position corresponding to said channel region, and said hole extending across said channel region in said channel length direction;

a capacitor insulating film comprising a ferroelectric film and formed to cover bottom and side surfaces of said hole, said capacitor insulating film including a first recess at a position corresponding to said channel region; and an upper electrode embedded in said first recess, and wherein said second transistor comprises a gate electrode having a length substantially the same as that of the first recess, in said channel length direction.

* * * * *